(12) United States Patent
Ekbatani

(10) Patent No.: US 11,490,451 B2
(45) Date of Patent: Nov. 1, 2022

(54) TECHNIQUES FOR ADC CLIPPING RATE BASED LNA GAIN VALUE MODIFICATION

(71) Applicant: QUALCOMM Incorporated, San Diego, CA (US)

(72) Inventor: Siavash Ekbatani, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 16 days.

(21) Appl. No.: 17/108,767

(22) Filed: Dec. 1, 2020

(65) Prior Publication Data
US 2022/0174784 A1  Jun. 2, 2022

(51) Int. Cl.
*H04W 84/04* (2009.01)
*H03M 1/12* (2006.01)
*H03M 1/18* (2006.01)
*H04L 27/26* (2006.01)

(52) U.S. Cl.
CPC ....... *H04W 84/042* (2013.01); *H03M 1/1245* (2013.01); *H03M 1/18* (2013.01); *H04L 27/2623* (2013.01)

(58) Field of Classification Search
CPC ...... H03M 1/185; H03M 1/12; H03M 1/1245; H03M 1/18; H04W 84/042; H04L 27/2623
See application file for complete search history.

(56) References Cited

U.S. PATENT DOCUMENTS

| | | | |
|---|---|---|---|
| 6,748,200 B1 | 6/2004 | Webster et al. | |
| 2006/0014507 A1* | 1/2006 | Giancola | H03G 3/3052 455/232.1 |
| 2007/0135071 A1 | 6/2007 | Lee et al. | |
| 2007/0224959 A1* | 9/2007 | Hendrix | H04B 1/28 455/232.1 |

OTHER PUBLICATIONS

International Search Report and Written Opinion—PCT/US2021/072177—ISA/EPO—dated Feb. 10, 2022.

* cited by examiner

*Primary Examiner* — Sung S Ahn
(74) *Attorney, Agent, or Firm* — Dalei Dong; Harrity & Harrity, LLP

(57) ABSTRACT

Various aspects of the present disclosure generally relate to wireless communication. In some aspects, a receiver device may identify an analog to digital converter (ADC) clipping rate for one or more measurement windows. The receiver device may modify, based at least in part on a determination that the ADC clipping rate does not satisfy a threshold, a low noise amplifier (LNA) gain value to be used by the receiver device. The receiver device may receive a signal using the modified LNA gain value. Numerous other aspects are provided.

30 Claims, 8 Drawing Sheets

TECHNIQUES FOR ADC CLIPPING RATE BASED LNA GAIN VALUE MODIFICATION

FIELD OF THE DISCLOSURE

Aspects of the present disclosure generally relate to wireless communication and to techniques and apparatuses for analog to digital converter (ADC) clipping rate based low noise amplification (LNA) gain value modification.

DESCRIPTION OF RELATED ART

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power, or the like). Examples of such multiple-access technologies include code division multiple access (CDMA) systems, time division multiple access (TDMA) systems, frequency-division multiple access (FDMA) systems, orthogonal frequency-division multiple access (OFDMA) systems, single-carrier frequency-division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

A wireless network may include a number of base stations (BSs) that can support communication for a number of user equipment (UEs). A user equipment (UE) may communicate with a base station (BS) via the downlink and uplink. The downlink (or forward link) refers to the communication link from the BS to the UE, and the uplink (or reverse link) refers to the communication link from the UE to the BS. As will be described in more detail herein, a BS may be referred to as a Node B, a gNB, an access point (AP), a radio head, a transmit receive point (TRP), a New Radio (NR) BS, a 5G Node B, or the like.

The above multiple access technologies have been adopted in various telecommunication standards to provide a common protocol that enables different user equipment to communicate on a municipal, national, regional, and even global level. New Radio (NR), which may also be referred to as 5G, is a set of enhancements to the LTE mobile standard promulgated by the Third Generation Partnership Project (3GPP). NR is designed to better support mobile broadband Internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink (DL), using CP-OFDM and/or SC-FDM (e.g., also known as discrete Fourier transform spread OFDM (DFT-s-OFDM)) on the uplink (UL), as well as supporting beamforming, multiple-input multiple-output (MIMO) antenna technology, and carrier aggregation. As the demand for mobile broadband access continues to increase, further improvements in LTE, NR, and other radio access technologies remain useful.

SUMMARY

In some aspects, a method of wireless communication performed by a receiver device includes identifying an analog to digital converter (ADC) clipping rate for one or more measurement windows; modifying, based at least in part on a determination that the ADC clipping rate does not satisfy a threshold, a low noise amplifier (LNA) gain value to be used by the receiver device; and receiving a signal using the modified LNA gain value.

In some aspects, identifying the ADC clipping rate for the one or more measurement windows includes identifying, during each measurement window of the one or more measurement windows, an ADC clipping rate for each measurement window; and identifying the ADC clipping rate for the one or more measurement windows based at least in part on averaging the ADC clipping rate for each measurement window of the one or more measurement windows.

In some aspects, identifying, during each measurement window of the one or more measurement windows, the ADC clipping rate for each measurement window includes measuring, during a measurement window of the one or more measurement windows, a plurality of ADC samples; determining a number of clipping occurrences associated with the plurality of ADC samples; and determining an ADC clipping rate for the measurement window based at least in part on the number of clipping occurrences and a number of the plurality of ADC samples.

In some aspects, determining the number of clipping occurrences associated with the plurality of ADC samples includes determining a number of occurrences in which a measurement of an ADC sample, of the plurality of ADC samples, is greater than or equal to a saturation threshold associated with the ADC of the receiver device.

In some aspects, receiving the signal using the modified LNA gain value includes processing the signal using the modified LNA gain value, wherein processing the signal includes: applying the modified LNA gain value to the signal; and performing an analog to digital conversion of the signal after the application of the modified LNA gain value to the signal.

In some aspects, modifying the LNA gain value includes identifying a first LNA gain value that was used by the receiver device during the one or more measurement windows; and reducing the first LNA gain value to a second LNA gain value based at least in part on the determination that the ADC clipping rate does not satisfy the threshold. In some aspects, the first LNA gain value is associated with a first LNA gain state and the second LNA gain value is associated with a second LNA gain state. In some aspects, the threshold is based at least in part on a structure of the ADC of the receiver device.

In some aspects, the method includes storing, for the one or more measurement windows, one or more ADC clipping rates in a first-in-first-out (FIFO) manner, wherein the FIFO manner includes storing a set number of ADC clipping rates. In some aspects, identifying the ADC clipping rate for the one or more measurement windows includes identifying the ADC clipping rate for the one or more measurement windows based at least in part on the one or more stored ADC clipping rates.

In some aspects, an in-band bandwidth of the ADC includes at least one intended signal and at least one unintended signal.

In some aspects, a receiver device for wireless communication includes a memory and one or more processors coupled to the memory. The memory and the one or more processors may be configured to: identify an ADC clipping rate for one or more measurement windows; modify, based at least in part on a determination that the ADC clipping rate does not satisfy a threshold, an LNA gain value to be used by the receiver device; and receive a signal using the modified LNA gain value.

In some aspects, the one or more processors, when identifying the ADC clipping rate for the one or more measurement windows, are configured to identify, during each measurement window of the one or more measurement windows, an ADC clipping rate for each measurement window; and identify the ADC clipping rate for the one or more measurement windows based at least in part on averaging the ADC clipping rate for each measurement window of the one or more measurement windows.

In some aspects, the one or more processors, when identifying, during each measurement window of the one or more measurement windows, the ADC clipping rate for each measurement window, are configured to measure, during a measurement window of the one or more measurement windows, a plurality of ADC samples; determine a number of clipping occurrences associated with the plurality of ADC samples; and determine an ADC clipping rate for the measurement window based at least in part on the number of clipping occurrences and a number of the plurality of ADC samples.

In some aspects, the one or more processors, when determining the number of clipping occurrences associated with the plurality of ADC samples, are configured to determine a number of occurrences in which a measurement of an ADC sample, of the plurality of ADC samples, is greater than or equal to a saturation threshold associated with the ADC of the receiver device.

In some aspects, the one or more processors, when receiving the signal using the modified LNA gain value, are configured to process the signal using the modified LNA gain value, wherein processing the signal includes: applying the modified LNA gain value to the signal; and performing an analog to digital conversion of the signal after the application of the modified LNA gain value to the signal.

In some aspects, the one or more processors, when modifying the LNA gain value, are configured to identify a first LNA gain value that was used by the receiver device during the one or more measurement windows; and reduce the first LNA gain value to a second LNA gain value based at least in part on the determination that the ADC clipping rate does not satisfy the threshold. In some aspects, the first LNA gain value is associated with a first LNA gain state and the second LNA gain value is associated with a second LNA gain state. In some aspects, the threshold is based at least in part on a structure of the ADC of the receiver device.

In some aspects, the one or more processors are further configured to store, for the one or more measurement windows, one or more ADC clipping rates in a FIFO manner, wherein the FIFO manner includes storing a set number of ADC clipping rates. In some aspects, the one or more processors, when identifying the ADC clipping rate for the one or more measurement windows, are configured to identify the ADC clipping rate for the one or more measurement windows based at least in part on the one or more stored ADC clipping rates.

In some aspects, an in-band bandwidth of the ADC includes at least one intended signal and at least one unintended signal.

In some aspects, a non-transitory computer-readable medium storing a set of instructions for wireless communication includes one or more instructions that, when executed by one or more processors of a receiver device, cause the receiver device to: identify an ADC clipping rate for one or more measurement windows; modify, based at least in part on a determination that the ADC clipping rate does not satisfy a threshold, an LNA gain value to be used by the receiver device; and receive a signal using the modified LNA gain value.

In some aspects, the one or more instructions, that cause the receiver device to identify the ADC clipping rate for the one or more measurement windows, cause the receiver device to identify, during each measurement window of the one or more measurement windows, an ADC clipping rate for each measurement window; and identify the ADC clipping rate for the one or more measurement windows based at least in part on averaging the ADC clipping rate for each measurement window of the one or more measurement windows.

In some aspects, the one or more instructions, that cause the receiver device to identify, during each measurement window of the one or more measurement windows, the ADC clipping rate for each measurement window, cause the receiver device to measure, during a measurement window of the one or more measurement windows, a plurality of ADC samples; determine a number of clipping occurrences associated with the plurality of ADC samples; and determine an ADC clipping rate for the measurement window based at least in part on the number of clipping occurrences and a number of the plurality of ADC samples.

In some aspects, the one or more instructions, that cause the receiver device to determine the number of clipping occurrences associated with the plurality of ADC samples, cause the receiver device to determine a number of occurrences in which a measurement of an ADC sample, of the plurality of ADC samples, is greater than or equal to a saturation threshold associated with the ADC of the receiver device.

In some aspects, the one or more instructions, that cause the receiver device to receive the signal using the modified LNA gain value, cause the receiver device to process the signal using the modified LNA gain value, wherein processing the signal includes: applying the modified LNA gain value to the signal; and performing an analog to digital conversion of the signal after the application of the modified LNA gain value to the signal.

In some aspects, the one or more instructions, that cause the receiver device to modify the LNA gain value, cause the receiver device to identify a first LNA gain value that was used by the receiver device during the one or more measurement windows; and reduce the first LNA gain value to a second LNA gain value based at least in part on the determination that the ADC clipping rate does not satisfy the threshold. In some aspects, the first LNA gain value is associated with a first LNA gain state and the second LNA gain value is associated with a second LNA gain state. In some aspects, the threshold is based at least in part on a structure of the ADC of the receiver device.

In some aspects, the one or more instructions further cause the receiver device to: store, for the one or more measurement windows, one or more ADC clipping rates in a FIFO manner, wherein the FIFO manner includes storing a set number of ADC clipping rates. In some aspects, the one or more instructions, that cause the receiver device to identify the ADC clipping rate for the one or more measurement windows, cause the receiver device to identify the ADC clipping rate for the one or more measurement windows based at least in part on the one or more stored ADC clipping rates.

In some aspects, an in-band bandwidth of the ADC includes at least one intended signal and at least one unintended signal.

In some aspects, an apparatus for wireless communication includes means for identifying an ADC clipping rate for one or more measurement windows; means for modifying, based at least in part on a determination that the ADC clipping rate does not satisfy a threshold, an LNA gain value to be used by the apparatus; and means for receiving a signal using the modified LNA gain value.

In some aspects, the means for identifying the ADC clipping rate for the one or more measurement windows includes means for identifying, during each measurement window of the one or more measurement windows, an ADC clipping rate for each measurement window; and means for identifying the ADC clipping rate for the one or more measurement windows based at least in part on averaging the ADC clipping rate for each measurement window of the one or more measurement windows.

In some aspects, the means for identifying, during each measurement window of the one or more measurement windows, the ADC clipping rate for each measurement window includes means for measuring, during a measurement window of the one or more measurement windows, a plurality of ADC samples; means for determining a number of clipping occurrences associated with the plurality of ADC samples; and means for determining an ADC clipping rate for the measurement window based at least in part on the number of clipping occurrences and a number of the plurality of ADC samples.

In some aspects, the means for determining the number of clipping occurrences associated with the plurality of ADC samples includes means for determining a number of occurrences in which a measurement of an ADC sample, of the plurality of ADC samples, is greater than or equal to a saturation threshold associated with the ADC of the apparatus.

In some aspects, the means for receiving the signal using the modified LNA gain value includes means for processing the signal using the modified LNA gain value, wherein the means for processing the signal includes: means for applying the modified LNA gain value to the signal; and means for performing an analog to digital conversion of the signal after the application of the modified LNA gain value to the signal.

In some aspects, the means for modifying the LNA gain value includes means for identifying a first LNA gain value that was used by the apparatus during the one or more measurement windows; and means for reducing the first LNA gain value to a second LNA gain value based at least in part on the determination that the ADC clipping rate does not satisfy the threshold. In some aspects, the first LNA gain value is associated with a first LNA gain state and the second LNA gain value is associated with a second LNA gain state. In some aspects, the threshold is based at least in part on a structure of the ADC of the apparatus.

In some aspects, the apparatus includes means for storing, for the one or more measurement windows, one or more ADC clipping rates in a FIFO manner, wherein the FIFO manner includes storing a set number of ADC clipping rates. In some aspects, the means for identifying the ADC clipping rate for the one or more measurement windows includes means for identifying the ADC clipping rate for the one or more measurement windows based at least in part on the one or more stored ADC clipping rates.

In some aspects, an in-band bandwidth of the ADC includes at least one intended signal and at least one unintended signal.

Aspects generally include a method, apparatus, system, computer program product, non-transitory computer-readable medium, user equipment, base station, wireless communication device, and/or processing system as substantially described herein with reference to and as illustrated by the drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purposes of illustration and description, and not as a definition of the limits of the claims.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, algorithms, or the like (collectively referred to as "elements"). These elements may be implemented using hardware, software, or combinations thereof. Whether such elements are implemented as hardware or software depends upon the particular application and design constraints imposed on the overall system.

It should be noted that while aspects may be described herein using terminology commonly associated with a 5G or NR radio access technology (RAT), aspects of the present disclosure can be applied to other RATs, such as a 3G RAT, a 4G RAT, and/or a RAT subsequent to 5G (e.g., 6G).

Figure 1:
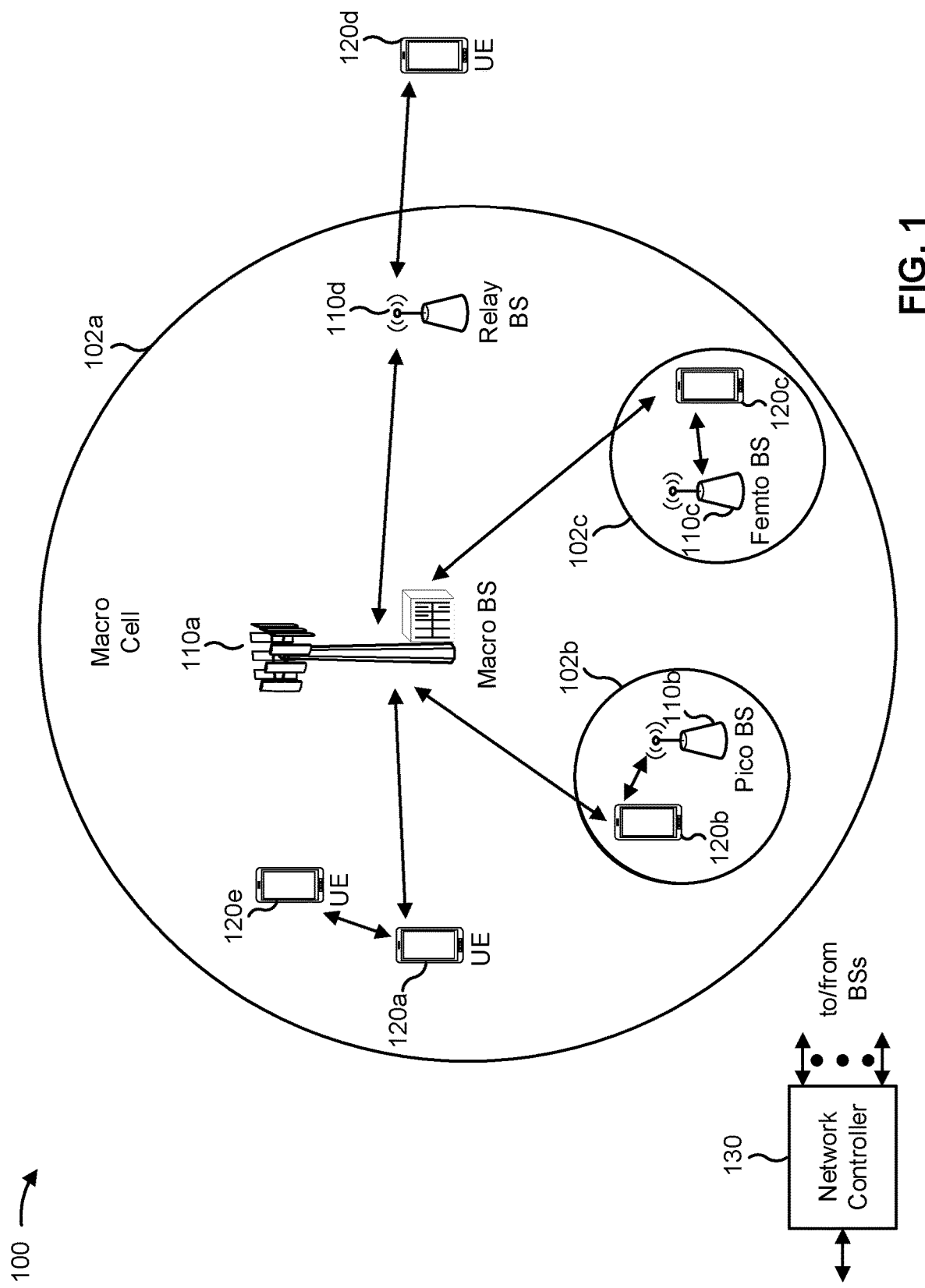
FIG. 1 is a diagram illustrating an example of a wireless network, in accordance with various aspects of the present disclosure.

FIG. 1 is a diagram illustrating an example of a wireless network 100, in accordance with various aspects of the present disclosure. The wireless network 100 may be or may include elements of a 5G (NR) network and/or an LTE network, among other examples. The wireless network 100 may include a number of base stations 110 (shown as BS 110a, BS 110b, BS 110c, and BS 110d) and other network entities. A base station (BS) is an entity that communicates with user equipment (UEs) and may also be referred to as an NR BS, a Node B, a gNB, a 5G node B (NB), an access point, a transmit receive point (TRP), or the like. Each BS may provide communication coverage for a particular geographic area. In 3GPP, the term "cell" can refer to a coverage area of a BS and/or a BS subsystem serving this coverage area, depending on the context in which the term is used.

A BS may provide communication coverage for a macro cell, a pico cell, a femto cell, and/or another type of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a closed subscriber group (CSG)). A BS for a macro cell may be referred to as a macro BS. A BS for a pico cell may be referred to as a pico BS. A BS for a femto cell may be referred to as a femto BS or a home BS. In the example shown in FIG. 1, a BS 110a may be a macro BS for a macro cell 102a, a BS 110b may be a pico BS for a pico cell 102b, and a BS 110c may be a femto BS for a femto cell 102c. A BS may support one or multiple (e.g., three) cells. The terms "eNB", "base station", "NR BS", "gNB", "TRP", "AP", "node B", "5G NB", and "cell" may be used interchangeably herein.

In some aspects, a cell may not necessarily be stationary, and the geographic area of the cell may move according to the location of a mobile BS. In some aspects, the BSs may be interconnected to one another and/or to one or more other BSs or network nodes (not shown) in the wireless network 100 through various types of backhaul interfaces, such as a direct physical connection or a virtual network, using any suitable transport network.

Wireless network 100 may also include relay stations. A relay station is an entity that can receive a transmission of data from an upstream station (e.g., a BS or a UE) and send a transmission of the data to a downstream station (e.g., a UE or a BS). A relay station may also be a UE that can relay transmissions for other UEs. In the example shown in FIG. 1, a relay BS 110d may communicate with macro BS 110a and a UE 120d in order to facilitate communication between BS 110a and UE 120d. A relay BS may also be referred to as a relay station, a relay base station, a relay, or the like.

Wireless network 100 may be a heterogeneous network that includes BSs of different types, such as macro BSs, pico BSs, femto BSs, relay BSs, or the like. These different types of BSs may have different transmit power levels, different coverage areas, and different impacts on interference in wireless network 100. For example, macro BSs may have a high transmit power level (e.g., 5 to 40 watts) whereas pico BSs, femto BSs, and relay BSs may have lower transmit power levels (e.g., 0.1 to 2 watts).

A network controller 130 may couple to a set of BSs and may provide coordination and control for these BSs. Network controller 130 may communicate with the BSs via a backhaul. The BSs may also communicate with one another, directly or indirectly, via a wireless or wireline backhaul.

UEs 120 (e.g., 120a, 120b, 120c) may be dispersed throughout wireless network 100, and each UE may be stationary or mobile. A UE may also be referred to as an access terminal, a terminal, a mobile station, a subscriber unit, a station, or the like. A UE may be a cellular phone (e.g., a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device or equipment, biometric sensors/devices, wearable devices (smart watches, smart clothing, smart glasses, smart wrist bands, smart jewelry (e.g., smart ring, smart bracelet)), an entertainment device (e.g., a music or video device, or a satellite radio), a vehicular component or sensor, smart meters/sensors, industrial manufacturing equipment, a global positioning system device, or any other suitable device that is configured to communicate via a wireless or wired medium.

Some UEs may be considered machine-type communication (MTC) or evolved or enhanced machine-type communication (eMTC) UEs. MTC and eMTC UEs include, for example, robots, drones, remote devices, sensors, meters, monitors, and/or location tags, that may communicate with a base station, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices, and/or may be implemented as NB-IoT (narrowband internet of things) devices. Some UEs may be considered a Customer Premises Equipment (CPE).

UE 120 may be included inside a housing that houses components of UE 120, such as processor components and/or memory components. In some aspects, the processor components and the memory components may be coupled together. For example, the processor components (e.g., one or more processors) and the memory components (e.g., a memory) may be operatively coupled, communicatively coupled, electronically coupled, and/or electrically coupled.

In general, any number of wireless networks may be deployed in a given geographic area. Each wireless network may support a particular RAT and may operate on one or more frequencies. A RAT may also be referred to as a radio technology, an air interface, or the like. A frequency may also be referred to as a carrier, a frequency channel, or the like. Each frequency may support a single RAT in a given geographic area in order to avoid interference between wireless networks of different RATs. In some cases, NR or 5G RAT networks may be deployed.

In some aspects, two or more UEs 120 (e.g., shown as UE 120a and UE 120e) may communicate directly using one or more sidelink channels (e.g., without using a base station 110 as an intermediary to communicate with one another). For example, the UEs 120 may communicate using peer-to-peer (P2P) communications, device-to-device (D2D) communications, a vehicle-to-everything (V2X) protocol (e.g., which may include a vehicle-to-vehicle (V2V) protocol or a vehicle-to-infrastructure (V2I) protocol), and/or a mesh network. In this case, the UE 120 may perform scheduling operations, resource selection operations, and/or other operations described elsewhere herein as being performed by the base station 110.

Devices of wireless network 100 may communicate using the electromagnetic spectrum, which may be subdivided based on frequency or wavelength into various classes, bands, channels, or the like. For example, devices of wireless network 100 may communicate using an operating band having a first frequency range (FR1), which may span from 410 MHz to 7.125 GHz, and/or may communicate using an operating band having a second frequency range (FR2), which may span from 24.25 GHz to 52.6 GHz. The frequencies between FR1 and FR2 are sometimes referred to as mid-band frequencies. Although a portion of FR1 is greater than 6 GHz, FR1 is often referred to as a "sub-6 GHz" band. Similarly, FR2 is often referred to as a "millimeter wave" band despite being different from the extremely high frequency (EHF) band (30 GHz-300 GHz) which is identified by the International Telecommunications Union (ITU) as a "millimeter wave" band. Thus, unless specifically stated otherwise, it should be understood that the term "sub-6 GHz" or the like, if used herein, may broadly represent frequencies less than 6 GHz, frequencies within FR1, and/or mid-band frequencies (e.g., greater than 7.125 GHz). Similarly, unless specifically stated otherwise, it should be understood that the term "millimeter wave" or the like, if used herein, may broadly represent frequencies within the EHF band, frequencies within FR2, and/or mid-band frequencies (e.g., less than 24.25 GHz). It is contemplated that the frequencies included in FR1 and FR2 may be modified, and techniques described herein are applicable to those modified frequency ranges.

As indicated above, FIG. 1 is provided as an example. Other examples may differ from what is described with regard to FIG. 1.

Figure 2:
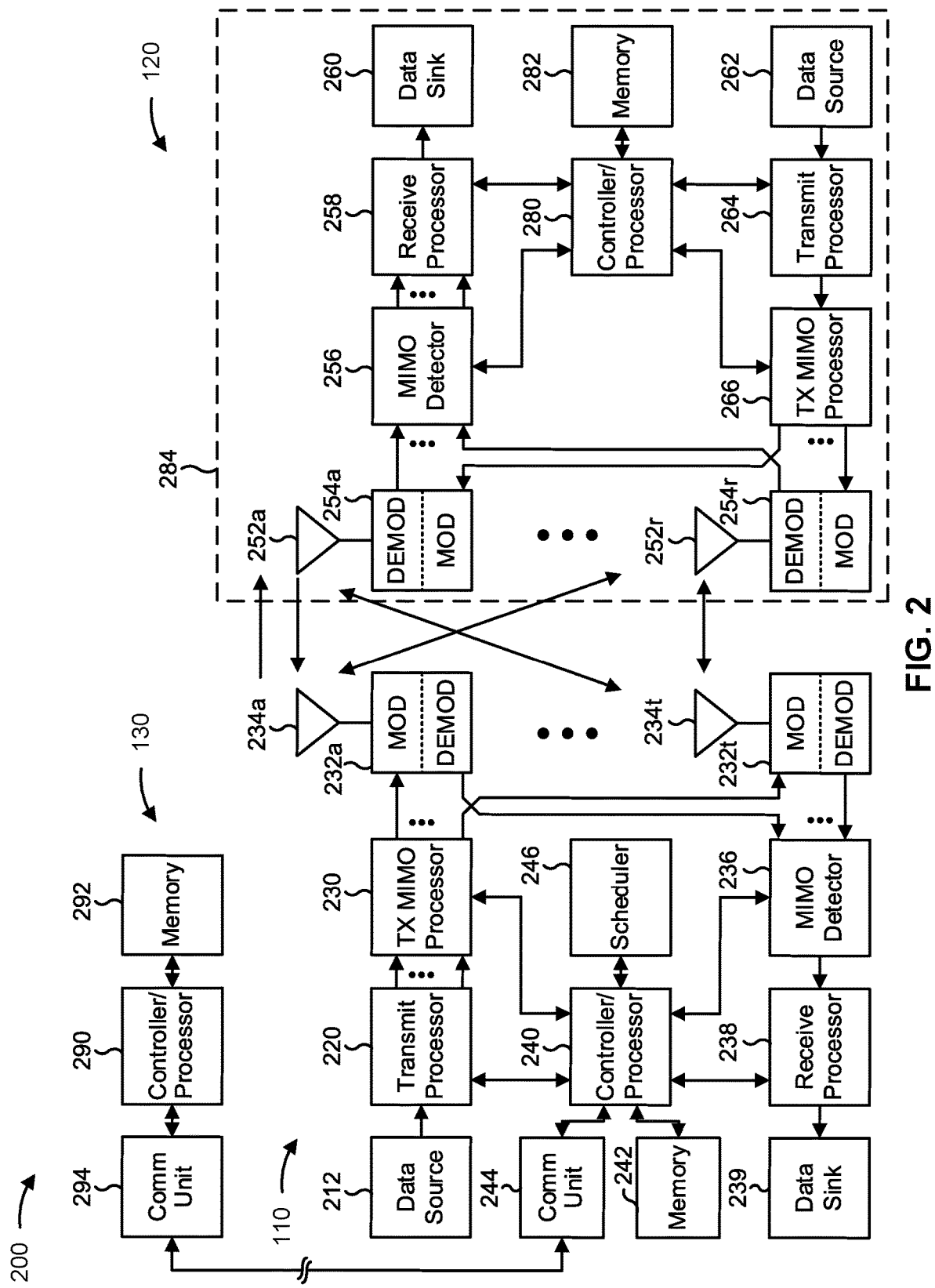
FIG. 2 is a diagram illustrating an example of a base station in communication with a UE in a wireless network, in accordance with various aspects of the present disclosure.

FIG. 2 is a diagram illustrating an example 200 of a base station 110 in communication with a UE 120 in a wireless network 100, in accordance with various aspects of the present disclosure. Base station 110 may be equipped with T antennas 234a through 234t, and UE 120 may be equipped with R antennas 252a through 252r, where in general T≥1 and R≥1.

At base station 110, a transmit processor 220 may receive data from a data source 212 for one or more UEs, select one or more modulation and coding schemes (MCS) for each UE based at least in part on channel quality indicators (CQIs) received from the UE, process (e.g., encode and modulate) the data for each UE based at least in part on the MCS(s) selected for the UE, and provide data symbols for all UEs. Transmit processor 220 may also process system information (e.g., for semi-static resource partitioning information (SRPI)) and control information (e.g., CQI requests, grants, and/or upper layer signaling) and provide overhead symbols and control symbols. Transmit processor 220 may also generate reference symbols for reference signals (e.g., a cell-specific reference signal (CRS) or a demodulation reference signal (DMRS)) and synchronization signals (e.g., a primary synchronization signal (PSS) or a secondary synchronization signal (SSS)). A transmit (TX) multiple-input multiple-output (MIMO) processor 230 may perform spatial processing (e.g., precoding) on the data symbols, the control symbols, the overhead symbols, and/or the reference symbols, if applicable, and may provide T output symbol streams to T modulators (MODs) 232a through 232t. Each modulator 232 may process a respective output symbol stream (e.g., for OFDM) to obtain an output sample stream. Each modulator 232 may further process (e.g., convert to analog, amplify, filter, and upconvert) the output sample stream to obtain a downlink signal. T downlink signals from modulators 232a through 232t may be transmitted via T antennas 234a through 234t, respectively.

At UE 120, antennas 252a through 252r may receive the downlink signals from base station 110 and/or other base stations and may provide received signals to demodulators (DEMODs) 254a through 254r, respectively. Each demodulator 254 may condition (e.g., filter, amplify, downconvert, and digitize) a received signal to obtain input samples. Each demodulator 254 may further process the input samples (e.g., for OFDM) to obtain received symbols. A MIMO detector 256 may obtain received symbols from all R demodulators 254a through 254r, perform MIMO detection on the received symbols if applicable, and provide detected symbols. A receive processor 258 may process (e.g., demodulate and decode) the detected symbols, provide decoded data for UE 120 to a data sink 260, and provide decoded control information and system information to a controller/processor 280. The term "controller/processor" may refer to one or more controllers, one or more processors, or a combination thereof. A channel processor may determine a reference signal received power (RSRP) parameter, a received signal strength indicator (RSSI) parameter, a reference signal received quality (RSRQ) parameter, an/or a channel quality indicator (CQI) parameter, among other examples. In some aspects, one or more components of UE 120 may be included in a housing 284.

Network controller 130 may include communication unit 294, controller/processor 290, and memory 292. Network controller 130 may include, for example, one or more devices in a core network. Network controller 130 may communicate with base station 110 via communication unit 294.

On the uplink, at UE 120, a transmit processor 264 may receive and process data from a data source 262 and control information (e.g., for reports that include RSRP, RSSI, RSRQ, and/or CQI) from controller/processor 280. Transmit processor 264 may also generate reference symbols for one or more reference signals. The symbols from transmit processor 264 may be precoded by a TX MIMO processor 266 if applicable, further processed by modulators 254a through 254r (e.g., for DFT-s-OFDM or CP-OFDM), and transmitted to base station 110. In some aspects, a modulator and a demodulator (e.g., MOD/DEMOD 254) of the UE 120 may be included in a modem of the UE 120. In some aspects, the UE 120 includes a transceiver. The transceiver may include any combination of antenna(s) 252, modulators and/or demodulators 254, MIMO detector 256, receive processor 258, transmit processor 264, and/or TX MIMO processor 266. The transceiver may be used by a processor (e.g., controller/processor 280) and memory 282 to perform aspects of any of the methods described herein.

At base station 110, the uplink signals from UE 120 and other UEs may be received by antennas 234, processed by demodulators 232, detected by a MIMO detector 236 if applicable, and further processed by a receive processor 238 to obtain decoded data and control information sent by UE 120. Receive processor 238 may provide the decoded data to a data sink 239 and the decoded control information to controller/processor 240. Base station 110 may include communication unit 244 and communicate to network controller 130 via communication unit 244. Base station 110 may include a scheduler 246 to schedule UEs 120 for downlink and/or uplink communications. In some aspects, a modulator and a demodulator (e.g., MOD/DEMOD 232) of the base station 110 may be included in a modem of the base station 110. In some aspects, the base station 110 includes a transceiver. The transceiver may include any combination of antenna(s) 234, modulators and/or demodulators 232, MIMO detector 236, receive processor 238, transmit processor 220, and/or TX MIMO processor 230. The transceiver may be used by a processor (e.g., controller/processor 240) and memory 242 to perform aspects of any of the methods described herein.

Controller/processor 240 of base station 110, controller/processor 280 of UE 120, and/or any other component(s) of FIG. 2 may perform one or more techniques associated with analog to digital converter (ADC) clipping rate based low noise amplification (LNA) gain value modification, as described in more detail elsewhere herein. In some aspects, a receiver device described herein is the UE 120, is included in the UE 120, or includes one or more components of the UE 120 shown in FIG. 2. For example, controller/processor 240 of base station 110, controller/processor 280 of UE 120, and/or any other component(s) of FIG. 2 may perform or direct operations of, for example, process 600 of FIG. 6, and/or other processes as described herein. Memories 242 and 282 may store data and program codes for base station 110 and UE 120, respectively. In some aspects, memory 242 and/or memory 282 may include a non-transitory computer-readable medium storing one or more instructions (e.g., code and/or program code) for wireless communication. For example, the one or more instructions, when executed (e.g., directly, or after compiling, converting, and/or interpreting) by one or more processors of the base station 110 and/or the UE 120, may cause the one or more processors, the UE 120, and/or the base station 110 to perform or direct operations of, for example, process 600 of FIG. 6, and/or other processes as described herein. In some aspects, executing instructions may include running the instructions, converting the instructions, compiling the instructions, and/or interpreting the instructions.

In some aspects, the receiver device includes means for identifying an ADC clipping rate for one or more measurement windows; means for modifying, based at least in part on a determination that the ADC clipping rate does not satisfy a threshold, an LNA gain value to be used by the receiver device; and/or means for receiving a signal using the modified LNA gain value. In some aspects, the means for the receiver device to perform operations described herein may include, for example, one or more of antenna 252, demodulator 254, MIMO detector 256, receive processor 258, transmit processor 264, TX MIMO processor 266, modulator 254, controller/processor 280, or memory 282.

In some aspects, the receiver device includes means for identifying, during each measurement window of the one or more measurement windows, an ADC clipping rate for each measurement window; and/or means for identifying the ADC clipping rate for the one or more measurement windows based at least in part on averaging the ADC clipping rate for each measurement window of the one or more measurement windows.

In some aspects, the receiver device includes means for measuring, during a measurement window of the one or more measurement windows, a plurality of ADC samples; means for determining a number of clipping occurrences associated with the plurality of ADC samples; and/or means for determining an ADC clipping rate for the measurement window based at least in part on the number of clipping occurrences and a number of the plurality of ADC samples.

In some aspects, the receiver device includes means for determining a number of occurrences in which a measurement of an ADC sample, of the plurality of ADC samples, is greater than or equal to a saturation threshold associated with the ADC of the receiver device.

In some aspects, the receiver device includes means for processing the signal using the modified LNA gain value, wherein the means for processing the signal includes: means for applying the modified LNA gain value to the signal; and/or means for performing an analog to digital conversion of the signal after the application of the modified LNA gain value to the signal.

In some aspects, the receiver device includes means for identifying a first LNA gain value that was used by the receiver device during the one or more measurement windows; and/or means for reducing the first LNA gain value to a second LNA gain value based at least in part on the determination that the ADC clipping rate does not satisfy the threshold.

In some aspects, the receiver device includes means for storing, for the one or more measurement windows, one or more ADC clipping rates in a first-in-first-out (FIFO) manner, wherein the FIFO manner includes storing a set number of ADC clipping rates. In some aspects, the receiver device includes means for identifying the ADC clipping rate for the one or more measurement windows based at least in part on the one or more stored ADC clipping rates.

As indicated above, FIG. 2 is provided as an example. Other examples may differ from what is described with regard to FIG. 2.

Figure 3:
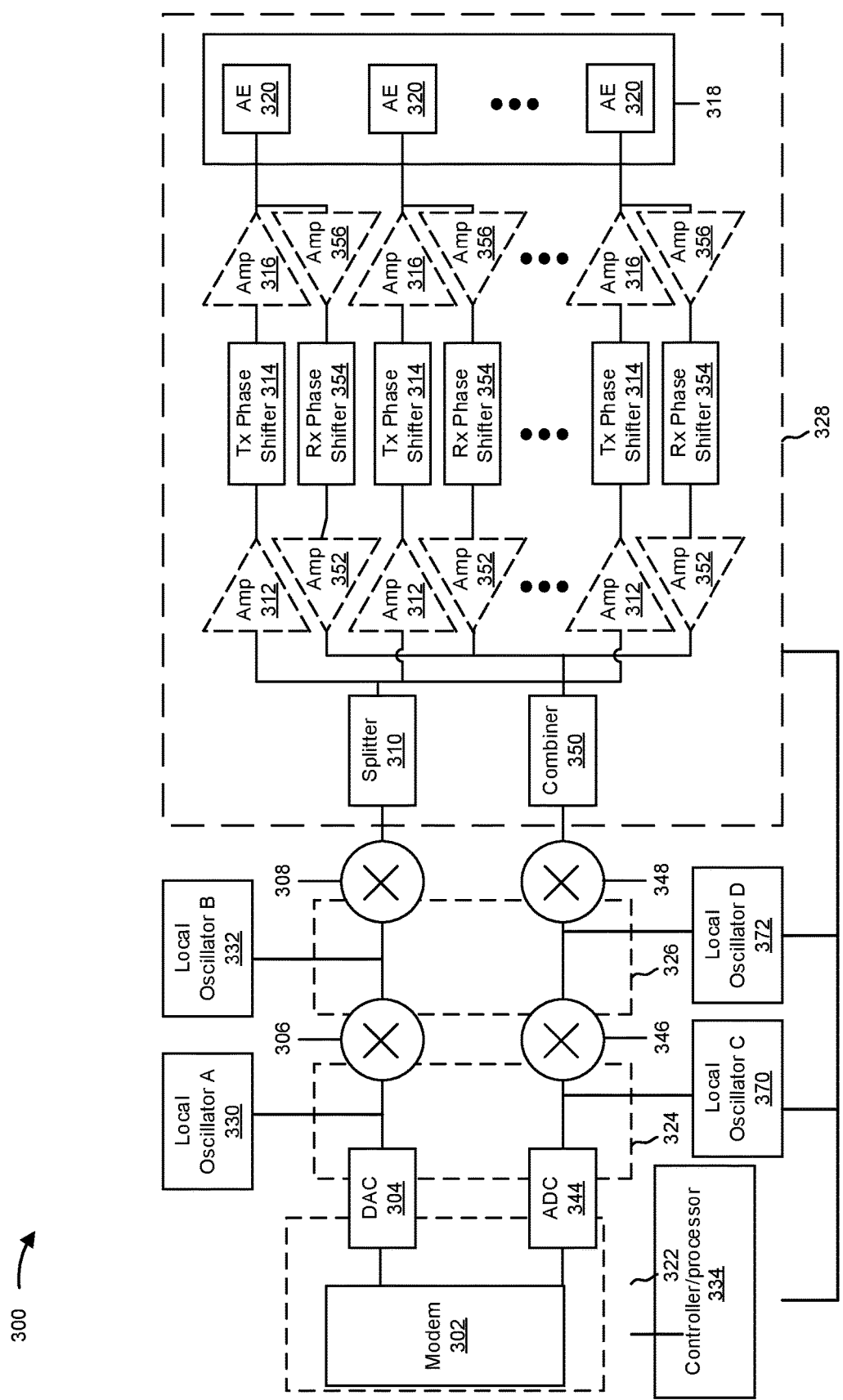
FIG. 3 is a diagram illustrating an example beamforming architecture that supports beamforming for millimeter wave communications, in accordance with various aspects of the present disclosure.

FIG. 3 is a diagram illustrating an example beamforming architecture 300 that supports beamforming for millimeter wave (mmW) communications, in accordance with various aspects of the present disclosure. In some aspects, architecture 300 may implement aspects of wireless network 100. In some aspects, architecture 300 may be implemented in a transmitting device (e.g., a first wireless communication device, UE, or base station) and/or a receiving device (e.g., a second wireless communication device, UE, or base station), as described herein.

Broadly, FIG. 3 is a diagram illustrating example hardware components of a wireless communication device in accordance with certain aspects of the disclosure. The illustrated components may include those that may be used for antenna element selection and/or for beamforming for transmission of wireless signals. There are numerous architectures for antenna element selection and implementing phase shifting, only one example of which is illustrated here. The architecture 300 includes a modem (modulator/demodulator) 302, a digital to analog converter (DAC) 304, a first mixer 306, a second mixer 308, and a splitter 310. The architecture 300 also includes multiple first amplifiers 312, multiple phase shifters 314, multiple second amplifiers 316, and an antenna array 318 that includes multiple antenna elements 320.

Transmission lines or other waveguides, wires, traces, and/or the like are shown connecting the various components to illustrate how signals to be transmitted may travel between components. Reference numbers 322, 324, 326, and 328 indicate regions in the architecture 300 in which different types of signals travel or are processed. Specifically, reference number 322 indicates a region in which digital baseband signals travel or are processed, reference number 324 indicates a region in which analog baseband signals travel or are processed, reference number 326 indicates a region in which analog intermediate frequency (IF) signals travel or are processed, and reference number 328 indicates a region in which analog radio frequency (RF) signals travel or are processed. The architecture also includes a local oscillator A 330, a local oscillator B 332, and a controller/processor 334. In some aspects, controller/processor 334 corresponds to controller/processor 240 of the base station described above in connection with FIG. 2 and/or controller/processor 280 of the UE described above in connection with FIG. 2.

Each of the antenna elements 320 may include one or more sub-elements for radiating or receiving RF signals. For example, a single antenna element 320 may include a first sub-element cross-polarized with a second sub-element that can be used to independently transmit cross-polarized signals. The antenna elements 320 may include patch antennas, dipole antennas, or other types of antennas arranged in a linear pattern, a two dimensional pattern, or another pattern. A spacing between antenna elements 320 may be such that signals with a desired wavelength transmitted separately by the antenna elements 320 may interact or interfere (e.g., to form a desired beam). For example, given an expected range of wavelengths or frequencies, the spacing may provide a quarter wavelength, half wavelength, or other fraction of a wavelength of spacing between neighboring antenna elements 320 to allow for interaction or interference of signals transmitted by the separate antenna elements 320 within that expected range.

The modem 302 processes and generates digital baseband signals and may also control operation of the DAC 304, first and second mixers 306, 308, splitter 310, first amplifiers 312, phase shifters 314, and/or the second amplifiers 316 to transmit signals via one or more or all of the antenna elements 320. The modem 302 may process signals and control operation in accordance with a communication standard such as a wireless standard discussed herein. The DAC 304 may convert digital baseband signals received from the modem 302 (and that are to be transmitted) into analog baseband signals. The first mixer 306 upconverts analog baseband signals to analog IF signals within an IF using a local oscillator A 330. For example, the first mixer 306 may mix the signals with an oscillating signal generated by the local oscillator A 330 to "move" the baseband analog signals to the IF. In some cases, some processing or filtering (not shown) may take place at the IF. The second mixer 308 upconverts the analog IF signals to analog RF signals using the local oscillator B 332. Similar to the first mixer, the second mixer 308 may mix the signals with an oscillating signal generated by the local oscillator B 332 to "move" the IF analog signals to the RF or the frequency at which signals will be transmitted or received. The modem 302 and/or the controller/processor 334 may adjust the frequency of local oscillator A 330 and/or the local oscillator B 332 so that a desired IF and/or RF frequency is produced and used to facilitate processing and transmission of a signal within a desired bandwidth.

In the illustrated architecture 300, signals unconverted by the second mixer 308 are split or duplicated into multiple signals by the splitter 310. The splitter 310 in architecture 300 splits the RF signal into multiple identical or nearly identical RF signals. In other examples, the split may take place with any type of signal, including with baseband digital, baseband analog, or IF analog signals. Each of these signals may correspond to an antenna element 320, and the signal travels through and is processed by amplifiers 312, 316, phase shifters 314, and/or other elements corresponding to the respective antenna element 320 to be provided to and transmitted by the corresponding antenna element 320 of the antenna array 318. In one example, the splitter 310 may be an active splitter that is connected to a power supply and provides some gain so that RF signals exiting the splitter 310 are at a power level equal to or greater than the signal entering the splitter 310. In another example, the splitter 310 is a passive splitter that is not connected to power supply and the RF signals exiting the splitter 310 may be at a power level lower than the RF signal entering the splitter 310.

After being split by the splitter 310, the resulting RF signals may enter an amplifier, such as a first amplifier 312, or a phase shifter 314 corresponding to an antenna element 320. The first and second amplifiers 312, 316 are illustrated with dashed lines because one or both of them might not be necessary in some aspects. In some aspects, both the first amplifier 312 and second amplifier 316 are present. In some aspects, neither the first amplifier 312 nor the second amplifier 316 is present. In some aspects, one of the two amplifiers 312, 316 is present but not the other. By way of example, if the splitter 310 is an active splitter, the first amplifier 312 may not be used. By way of further example, if the phase shifter 314 is an active phase shifter that can provide a gain, the second amplifier 316 might not be used.

The amplifiers 312, 316 may provide a desired level of positive or negative gain. A positive gain (positive dB) may be used to increase an amplitude of a signal for radiation by a specific antenna element 320. A negative gain (negative dB) may be used to decrease an amplitude and/or suppress radiation of the signal by a specific antenna element. Each of the amplifiers 312, 316 may be controlled independently (e.g., by the modem 302 or the controller/processor 334) to provide independent control of the gain for each antenna element 320. For example, the modem 302 and/or the controller/processor 334 may have at least one control line connected to each of the splitter 310, first amplifiers 312, phase shifters 314, and/or second amplifiers 316 that may be used to configure a gain to provide a desired amount of gain for each component and thus each antenna element 320.

The phase shifter 314 may provide a configurable phase shift or phase offset to a corresponding RF signal to be transmitted. The phase shifter 314 may be a passive phase shifter not directly connected to a power supply. Passive phase shifters might introduce some insertion loss. The second amplifier 316 may boost the signal to compensate for the insertion loss. The phase shifter 314 may be an active phase shifter connected to a power supply such that the active phase shifter provides some amount of gain or prevents insertion loss. The settings of each of the phase shifters 314 are independent, meaning that each can be independently set to provide a desired amount of phase shift or the same amount of phase shift or some other configuration. The modem 302 and/or the controller/processor 334 may have at least one control line connected to each of the phase shifters 314 and which may be used to configure the phase shifters 314 to provide a desired amount of phase shift or phase offset between antenna elements 320.

In the illustrated architecture 300, RF signals received by the antenna elements 320 are provided to one or more first amplifiers 356 to boost the signal strength. The first amplifiers 356 may be connected to the same antenna arrays 318 (e.g., for time division duplex (TDD) operations). The first amplifiers 356 may be connected to different antenna arrays 318. The boosted RF signal is input into one or more phase shifters 354 to provide a configurable phase shift or phase offset for the corresponding received RF signal to enable reception via one or more Rx beams. The phase shifter 354 may be an active phase shifter or a passive phase shifter. The settings of the phase shifters 354 are independent, meaning that each can be independently set to provide a desired amount of phase shift or the same amount of phase shift or some other configuration. The modem 302 and/or the controller/processor 334 may have at least one control line connected to each of the phase shifters 354 and which may be used to configure the phase shifters 354 to provide a desired amount of phase shift or phase offset between antenna elements 320 to enable reception via one or more Rx beams.

The outputs of the phase shifters 354 may be input to one or more second amplifiers 352 for signal amplification of the phase shifted received RF signals. The second amplifiers 352 may be individually configured to provide a configured amount of gain. The second amplifiers 352 may be individually configured to provide an amount of gain to ensure that the signals input to combiner 350 have the same magnitude. The amplifiers 352 and/or 356 are illustrated in dashed lines because they might not be necessary in some aspects. In some aspects, both the amplifier 352 and the amplifier 356 are present. In another aspect, neither the amplifier 352 nor the amplifier 356 are present. In other aspects, one of the amplifiers 352, 356 is present but not the other.

In the illustrated architecture 300, signals output by the phase shifters 354 (via the amplifiers 352 when present) are combined in combiner 350. The combiner 350 in architecture 300 combines the RF signal into a signal. The combiner 350 may be a passive combiner (e.g., not connected to a power source), which may result in some insertion loss. The combiner 350 may be an active combiner (e.g., connected to a power source), which may result in some signal gain. When combiner 350 is an active combiner, it may provide a different (e.g., configurable) amount of gain for each input signal so that the input signals have the same magnitude when they are combined. When combiner 350 is an active combiner, the combiner 350 may not need the second amplifier 352 because the active combiner may provide the signal amplification.

The output of the combiner 350 is input into mixers 348 and 346. Mixers 348 and 346 generally down convert the received RF signal using inputs from local oscillators 372 and 370, respectively, to create intermediate or baseband signals that carry the encoded and modulated information. The output of the mixers 348 and 346 are input into an analog-to-digital converter (ADC) 344 for conversion to digital signals. The digital signals output from ADC 344 is input to modem 302 for baseband processing, such as decoding, de-interleaving, and/or the like.

In some aspects, the architecture 300 may include an automatic gain control (AGC) component, which refers to mechanisms to tune or otherwise configure a radio frequency front end (RFFE) and/or other receive components described herein to match a desired received signal power and thereby prevent the receive components (such as ADC 344) from becoming saturated. For example, the AGC component may be implemented using one or more circuits (e.g., a closed-loop feedback regulating circuit) to maintain a stable signal level at an output stage regardless of variations in the signal level at an input stage. The AGC component may be used to maintain a signal level at a setpoint for one or more receive components, such as ADC 344. In some aspects, the AGC component may include, or may control, one or more amplifiers described herein.

The architecture 300 is given by way of example only to illustrate an architecture for transmitting and/or receiving signals. In some cases, the architecture 300 and/or each portion of the architecture 300 may be repeated multiple times within an architecture to accommodate or provide an arbitrary number of RF chains, antenna elements, and/or antenna panels. Furthermore, numerous alternate architectures are possible and contemplated. For example, although only a single antenna array 318 is shown, two, three, or more antenna arrays may be included, each with one or more of their own corresponding amplifiers, phase shifters, splitters, mixers, DACs, ADCs, and/or modems. For example, a single UE may include two, four, or more antenna arrays for transmitting or receiving signals at different physical locations on the UE or in different directions.

Furthermore, mixers, splitters, amplifiers, phase shifters and other components may be located in different signal type areas (e.g., represented by different ones of the reference numbers 322, 324, 326, 328) in different implemented architectures. For example, a split of the signal to be transmitted into multiple signals may take place at the analog RF, analog IF, analog baseband, or digital baseband frequencies in different examples. Similarly, amplification and/or phase shifts may also take place at different frequencies. For example, in some aspects, one or more of the splitter 310, amplifiers 312, 316, or phase shifters 314 may be located between the DAC 304 and the first mixer 306 or between the first mixer 306 and the second mixer 308. In one example, the functions of one or more of the components may be combined into one component. For example, the phase shifters 314 may perform amplification to include or replace the first and/or or second amplifiers 312, 316. By way of another example, a phase shift may be implemented by the second mixer 308 to obviate the need for a separate phase shifter 314. This technique is sometimes called local oscillator (LO) phase shifting. In some aspects of this configuration, there may be multiple IF to RF mixers (e.g., for each antenna element chain) within the second mixer 308, and the local oscillator B 332 may supply different local oscillator signals (with different phase offsets) to each IF to RF mixer.

The modem 302 and/or the controller/processor 334 may control one or more of the other components 304 through 372 to select one or more antenna elements 320 and/or to form beams for transmission of one or more signals. For example, the antenna elements 320 may be individually selected or deselected for transmission of a signal (or signals) by controlling an amplitude of one or more corresponding amplifiers, such as the first amplifiers 312 and/or the second amplifiers 316. Beamforming includes generation of a beam using multiple signals on different antenna elements, where one or more or all of the multiple signals are shifted in phase relative to each other. The formed beam may carry physical or higher layer reference signals or information. As each signal of the multiple signals is radiated from a respective antenna element 320, the radiated signals interact, interfere (constructive and destructive interference), and amplify each other to form a resulting beam. The shape (such as the amplitude, width, and/or presence of side lobes) and the direction (such as an angle of the beam relative to a surface of the antenna array 318) can be dynamically controlled by modifying the phase shifts or phase offsets imparted by the phase shifters 314 and amplitudes imparted by the amplifiers 312, 316 of the multiple signals relative to each other. The controller/processor 334 may be located partially or fully within one or more other components of the architecture 300. For example, the controller/processor 334 may be located within the modem 302 in some aspects.

As indicated above, FIG. 3 is provided as an example. Other examples may differ from what is described with regard to FIG. 3.

Figure 4:
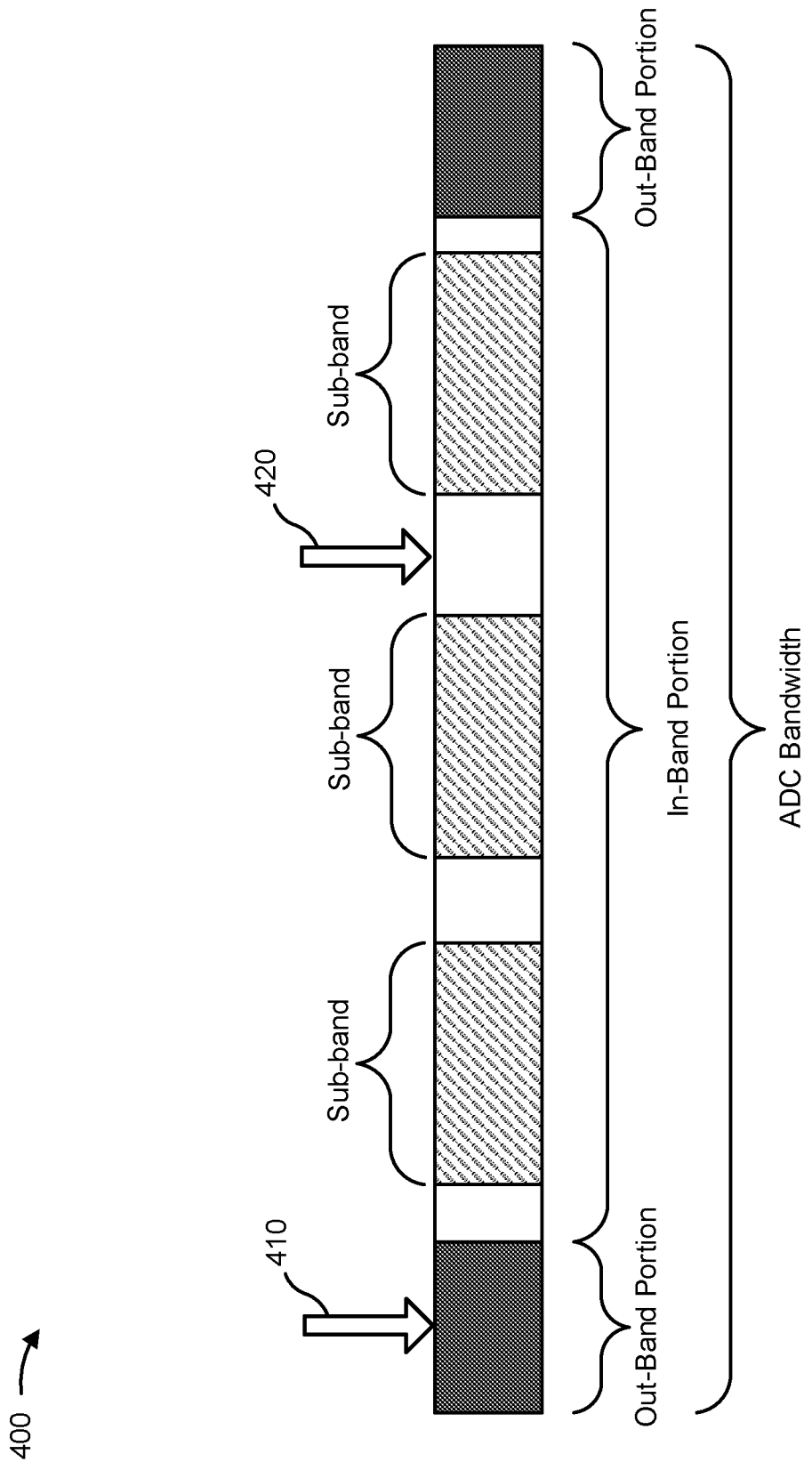
FIG. 4 is a diagram illustrating an example of an analog to digital converter (ADC) bandwidth that includes one or more interfering signals, in accordance with various aspects of the present disclosure.

FIG. 4 is a diagram illustrating an example 400 of an ADC bandwidth that includes one or more interfering signals, in accordance with various aspects of the present disclosure. An interfering signal may be a signal received by a receiver that is transmitted by a neighboring cell (e.g., and not intended for the receiver) or caused by self-interference (e.g., from a signal transmitted by the receiver). An interfering signal may be referred to as a jammer, an unwanted signal, an unintended signal, or an interferer.

As shown in FIG. 4, an ADC of a receiver device may be associated with an ADC bandwidth. The ADC bandwidth may be a range of frequencies of analog signals that the ADC is capable of converting to digital signals or a bandwidth of a signal that is provided to the ADC. In some aspects, the ADC bandwidth may be less than a bandwidth of a signal received by the receiver device. As shown in FIG. 4, the ADC bandwidth may include an in-band portion and an out-band portion. The in-band portion may be a portion of the ADC bandwidth in which a signal transmitted by a transmitter device exists. The out-band portion may be a portion of the ADC bandwidth associated with guard bands. For example, a transmitter device (e.g., a base station 110) may place one or more guard bands within a signal to avoid interference with adjacent bandwidths.

The ADC may receive signals that are within the ADC bandwidth. Therefore, when determining a setpoint of the ADC (e.g., a signal level or signal strength that is input to the ADC), signals that are within the ADC bandwidth should be accounted for. For example, an AGC component of the receiver device may determine the setpoint of the ADC. The AGC component may determine the setpoint to maximize a signal to noise ratio (SNR) experienced by the received signal (e.g., at an output of the ADC) while also avoiding a saturation of the ADC. For example, above a signal strength, the ADC may become saturated, resulting in a degradation of the SNR of the received signal. Therefore, the AGC component may determine a setpoint to avoid saturating the ADC.

In some cases, an interfering signal 410 may be received within an out-band portion of the ADC bandwidth. The receiver device may account for or identify the interfering signal 410 by passing the signal through two filters, a first filter having a wider bandwidth than a second filter. The receiver device may compare an output of the first filter (e.g., a signal power output of the first filter) to an output of the second filter (e.g., a signal power output of the second filter) to identify an indication of the interfering signal 410. In this way, the receiver device may roughly identify the presence of the interfering signal 410. The technique described above may be referred to as adjacent channel interference (ACI) padding. In some cases, the AGC component of the receiver device may reduce the setpoint of the ADC based at least in part on identifying the presence of the interfering signal 410. In some cases, the receiver device may reject the interfering signal 410 based at least in part on identifying the interfering signal 41 as described above. However, this requires significant processing resources and additional hardware components to pass the signal through two filters, measure the output of the filters, and compare the measurements of the outputs.

In some cases, an interfering signal 420 may be received within an in-band portion of the ADC bandwidth. For example, the receiver device may be operating in a shared receive scenario. In that case, the ADC may be serving multiple adjacent sub carriers. For example, as shown in FIG. 4, the ADC bandwidth may include multiple sub-bands. In some cases, the interfering signal 420 may be outside of the sub-bands, but within the in-band portion of the ADC bandwidth. For example, using intermediate frequency local oscillator (IF LO) management, the receiver device may be capable of anticipating the interfering signal 420 and may place the interfering signal 420 outside of the sub-bands or sub-carriers of the signal so as to avoid interfering with or corrupting signals within the sub-bands or within the sub-carriers. However, as the interfering signal 420 is still within the ADC bandwidth, a setpoint of the ADC may be reduced to avoid saturation of the ADC. For example, the setpoint of the ADC may be reduced such that the ADC experiences no saturation (e.g., such that the ADC does not need to perform any clipping). Reducing the setpoint of the ADC results in a reduction of the SNR of the signal at the output of the ADC.

In some cases, based on detecting the interfering signal 420, the AGC component of the receiver device may adjust a low noise amplifier (LNA) gain state lineup of the receiver device to mitigate the effects of the interfering signal 420. However, adjusting the LNA gain state lineup requires significant processing resources to modify the LNA gain state lineup to account for the interfering signal 420.

Some techniques and apparatuses described herein enable the receiver device to modify an LNA gain value based at least in part on an ADC clipping rate (or density) to maximize a setpoint of the ADC. An ADC clipping rate may be a rate at which the ADC performs clipping of a signal due to a saturation of the ADC. For example, for a total number of ADC samples, the ADC clipping rate may be the number of ADC samples in which clipping occurred, divided by the total number of ADC samples. In some cases, some level or rate of saturation of the ADC may be acceptable without degrading the SNR of the signal at the output of the ADC. Therefore, the ADC clipping rate of the ADC may be compared to a threshold. If the ADC clipping rate satisfies the threshold, the LNA gain value may not be modified (e.g., reduced). If the ADC clipping rate does not satisfy the threshold, then the LNA gain value may be modified (e.g., reduced). By modifying the LNA gain value based at least in part on the ADC clipping rate, the receiver device may maximize a setpoint of the ADC, resulting in a higher SNR of the signal at the output of the ADC.

As a result, the receiver device may be enabled to account for interfering signals (e.g., jammers) within an in-band portion of the ADC bandwidth when determining the setpoint of the ADC. Therefore, the receiver device may maximize the setpoint of the ADC without a risk of SNR degradation due to saturation of the ADC (e.g., based at least in part on the acceptable amount of saturation, as determined using the ADC clipping rate), resulting in a higher SNR of the signal. Moreover, accounting for interfering signals within the in-band portion of the ADC bandwidth using the ADC clipping rate as described above uses less processing resources and less hardware than the ACI padding technique and the LNA gain state lineup change described above.

Figure 5:
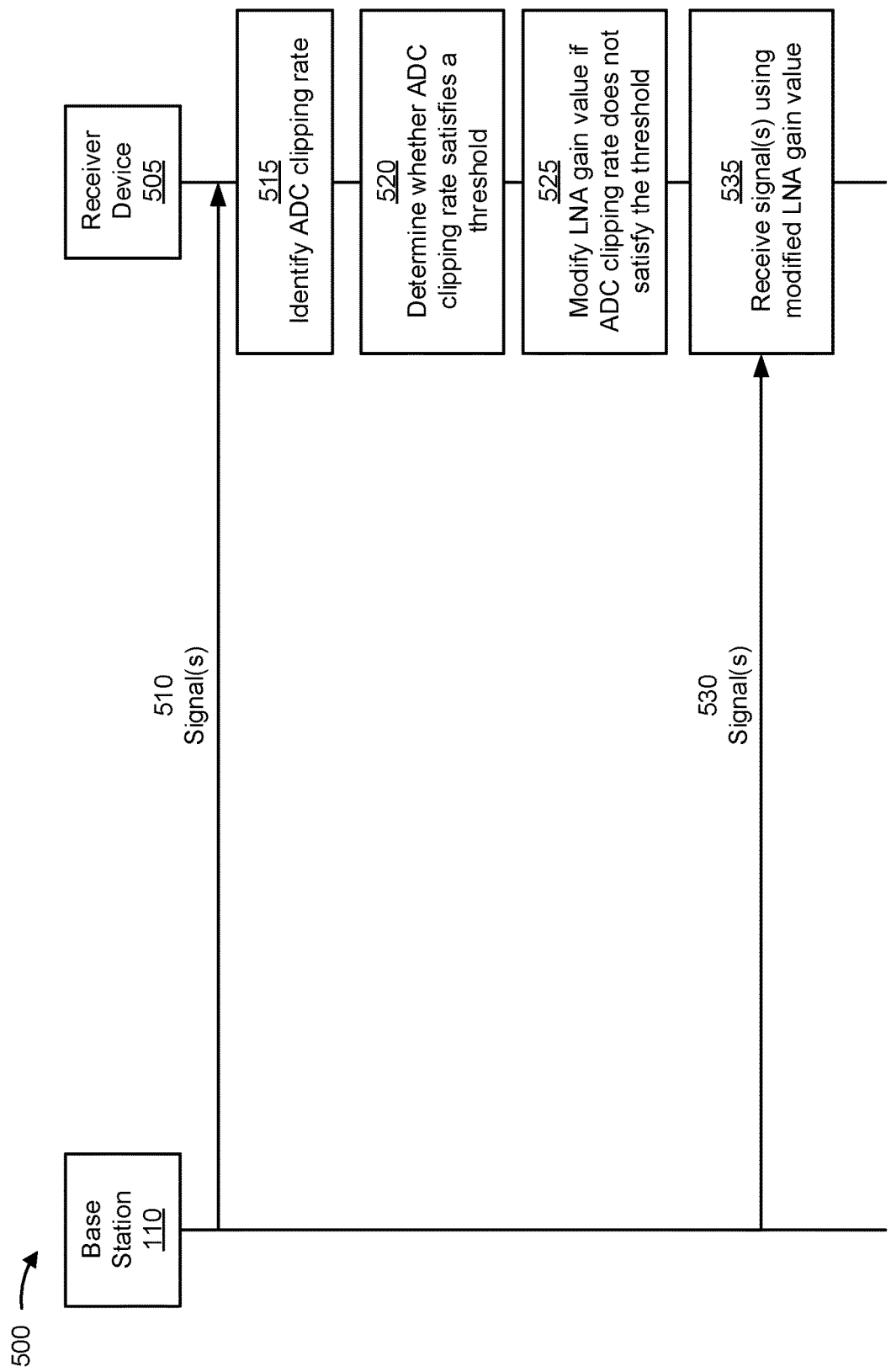
FIG. 5 is a diagram illustrating an example associated with ADC clipping rate based low noise amplification (LNA) gain value modification, in accordance with various aspects of the present disclosure.

FIG. 5 is a diagram illustrating an example 500 associated with ADC clipping rate based LNA gain value modification, in accordance with various aspects of the present disclosure. As shown in FIG. 5, example 500 includes communication between a base station 110 and a receiver device 505. In some aspects, the base station 110 and the receiver device 505 may be included in a wireless network, such as wireless network 100. The base station 110 and the receiver device 505 may communicate via a wireless access link, which may include an uplink and a downlink. The receiver device 505 may be a wireless communication device that includes an ADC and receives signals using the ADC. For example, the receiver device 505 may be a UE 120, a wireless node, or an integrated access and backhaul (IAB) node, among other examples.

As shown by reference number 510, the base station 110 may transmit, and the receiver device 505 may receive, one or more signals. The receiver device 505 may receive the one or more signals using a first LNA gain value (e.g., associated with a first LNA gain state). In some aspects, the first LNA gain value may be a high LNA gain value or may be associated with a high LNA gain state such that a setpoint of the ADC of the receiver device 505 is high (e.g., to increase an SNR of the signal at the output of the ADC). For example, the first LNA gain value may be associated with a highest LNA gain state. In some aspects, the receiver device 505 may receive one or more interfering signals (e.g., jammers) along with the intended signal (e.g., the one or more signals).

As shown by reference number 515, the receiver device 505 may identify and/or determine an ADC clipping rate of the ADC when using the first LNA gain value. In some aspects, the receiver device 505 may identify the ADC clipping rate periodically. For example, the receiver device 505 may identify the ADC clipping rate during a measurement window. In some aspects, measurement windows may be configured to occur once per slot or once per symbol (e.g., OFDM symbol), among other examples.

To identify and/or determine an ADC clipping rate during a measurement window, the receiver device 505 may measure (or identify measurements of) a plurality of ADC samples from the ADC of the receiver device 505. The receiver device 505 may identify a number of clipping occurrences included in the plurality of ADC samples. "Clipping occurrence" may refer to an ADC sample that has been clipped by the ADC. For example, when an ADC output saturates, a signal may be clipped by the ADC at a saturation threshold (e.g., a maximum or a minimum signal level supported by the ADC). The receiver device 505 may determine the ADC clipping rate for a measurement window based at least in part on the number of clipping occurrences and the number of ADC samples included in the measurement window. For example, the receiver device 505 may determine the ADC clipping rate for a measurement window by dividing the number of clipping occurrences by the number of ADC samples included in the measurement window. For example, if there are 200 ADC samples included in a measurement window and the receiver device 505 identifies 5 clipping occurrences, then the ADC clipping rate for the measurement window may be 0.025 (or 2.5%).

In some aspects, the receiver device 505 may store the ADC clipping rate for the measurement window in a FIFO buffer. For example, a FIFO buffer of the receiver device 505 may be configured to store a plurality of ADC clipping rates. In some aspects, the FIFO buffer may be configured to store a set number of entries (e.g., a set number of ADC clipping rates). After the set number of entries stored in the FIFO buffer has been reached, if a new entry is added to the FIFO buffer, an oldest entry (e.g., a first added entry) may be removed from the FIFO buffer. Therefore, older ADC clipping rates may be removed from the FIFO buffer, and no longer stored by the receiver device 505, as new ADC clipping rates are identified and/or determined by the receiver device 505.

As shown by reference number 520, the receiver device 505 may determine whether an ADC clipping rate satisfies a threshold. The ADC clipping rate may be based at least in part on the ADC clipping rates stored by the receiver device 505. For example, the ADC clipping rate may be an average of the ADC clipping rates stored in the FIFO buffer. In some aspects, the ADC clipping rate may be an ADC clipping rate of a most recent measurement window (or an average ADC clipping rate from ADC clipping rates of one or more most recent measurement windows). In some aspects, the receiver device 505 may periodically determine whether the ADC clipping rate satisfies the threshold (e.g., once per slot or once every n number of slots, among other examples).

By using an average ADC clipping rate (e.g., of ADC clipping rates stored in the FIFO buffer), the receiver device 505 may avoid determining that the threshold is not satisfied based at least in part on an isolated spike or increase in the ADC clipping rate. Moreover, the receiver device 505 may use a sliding window to determine the average ADC clipping rate, as the FIFO buffer may remove older ADC clipping rates as new ADC clipping rates are added to the FIFO buffer. By using the sliding window to determine and/or identify the average ADC clipping rate, the receiver device 505 may ensure that the ADC clipping rate is reflective of recent ADC clipping rates, resulting in a more accurate determination of the average ADC clipping rate at the ADC.

In some aspects, the value of the threshold may be based at least in part on a level of saturation that can be experienced by the ADC without degrading an SNR of a signal at the output of the ADC. In some aspects, a value of the threshold may be based at least in part on a structure of the ADC. For example, some ADC structures or configurations may be capable of experiencing a higher level of saturation (without experiencing a degradation of the SNR of the signal output by the ADC) than other ADC structures of configurations. Therefore, the value of the threshold may be based at least in part on the structure or configuration of the ADC of the receiver device 505.

As shown by reference number 525, the receiver device 505 may modify the LNA gain value being used by the receiver device 505 if the ADC clipping rate does not satisfy the threshold. For example, if the ADC clipping rate is greater than or equal to the value of the threshold, then the receiver device 505 may modify the LNA gain value. In some aspects, the receiver device 505 may modify the LNA gain value by reducing the LNA gain value such that a setpoint of the ADC is reduced (e.g., to reduce the ADC clipping rate of the ADC). If the ADC clipping rate satisfies the threshold (e.g., if the ADC clipping rate is less than the value of the threshold), then the receiver device 505 may not modify the LNA gain value. In some aspects, if the ADC clipping rate satisfies the threshold (or if the ADC clipping rate satisfies the threshold for an amount of time), then the receiver device 505 may modify the LNA gain value by increasing the LNA gain value.

The receiver device 505 may modify the LNA gain value by backing off or reducing the LNA gain value (e.g., used to receive the one or more signals, as described above). In some aspects, the receiver device 505 may reduce the LNA gain value in accordance with a gain state granularity. For example, the receiver device 505 may be configured with a set of LNA gain states. Each LNA gain state may be associated with an LNA gain value. The LNA gain states may be ordered from a highest LNA gain value to a lowest LNA gain value. The LNA gain value that is used by the receiver device 505 may be associated with a first LNA gain state. The receiver device 505 may modify the LNA gain value by switching from the first LNA gain state to a second LNA gain state. The second LNA gain state may be adjacent to the first LNA gain state (e.g., in an order of the LNA gain states) and may be associated with a lower LNA gain value than the first LNA gain state.

As shown by reference number 530, the base station 110 may transmit, and the receiver device 505 may receive, one or more additional signals. As shown by reference number 535, the receiver device 505 may receive the one or more additional signals using a modified LNA gain value. As a result, a setpoint of the ADC of the receiver device 505 may be reduced such that the ADC clipping rate of the ADC may be reduced. By reducing the ADC clipping rate, an SNR of the signal at the output of the ADC may be increased.

In some aspects, the receiver device 505 may include an AGC component. In some aspects, one or more (or all) functions described herein as being performed by the receiver device 505 may be performed by, or in connection with, the AGC component.

In some aspects, after modifying the LNA gain value and receiving the one or more additional signals using the modified LNA gain value, the receiver device 505 may repeat one or more (or all) of the actions described above. For example, the receiver device 505 may identify and/or determine a new ADC clipping rate of the ADC (e.g., when the receiver device 505 uses the modified LNA gain value). If the new ADC clipping rate satisfies the threshold, then the receiver device 505 may not modify the modified LNA gain value. If the new ADC clipping rate does not satisfy the threshold, then the receiver device 505 may modify the modified LNA gain value, as described above. For example, the UE may switch from the second LNA gain state to a third LNA gain state (e.g., where the third LNA gain state is adjacent to the second LNA gain state (e.g., in an order of the LNA gain states) and is associated with a lower LNA gain value than the second LNA gain state). As a result, the receiver device 505 may ensure that the setpoint of the ADC is maximized without degrading an SNR of a signal at the output of the ADC. Therefore, the receiver device 505 may account for interfering signals within the ADC bandwidth of the ADC (e.g., by modifying the LNA gain value based at least in part on the ADC clipping rate, as described above) and may also maximize the SNR of the signal at the output of the ADC.

As indicated above, FIG. 5 is provided as an example. Other examples may differ from what is described with respect to FIG. 5.

Figure 6:
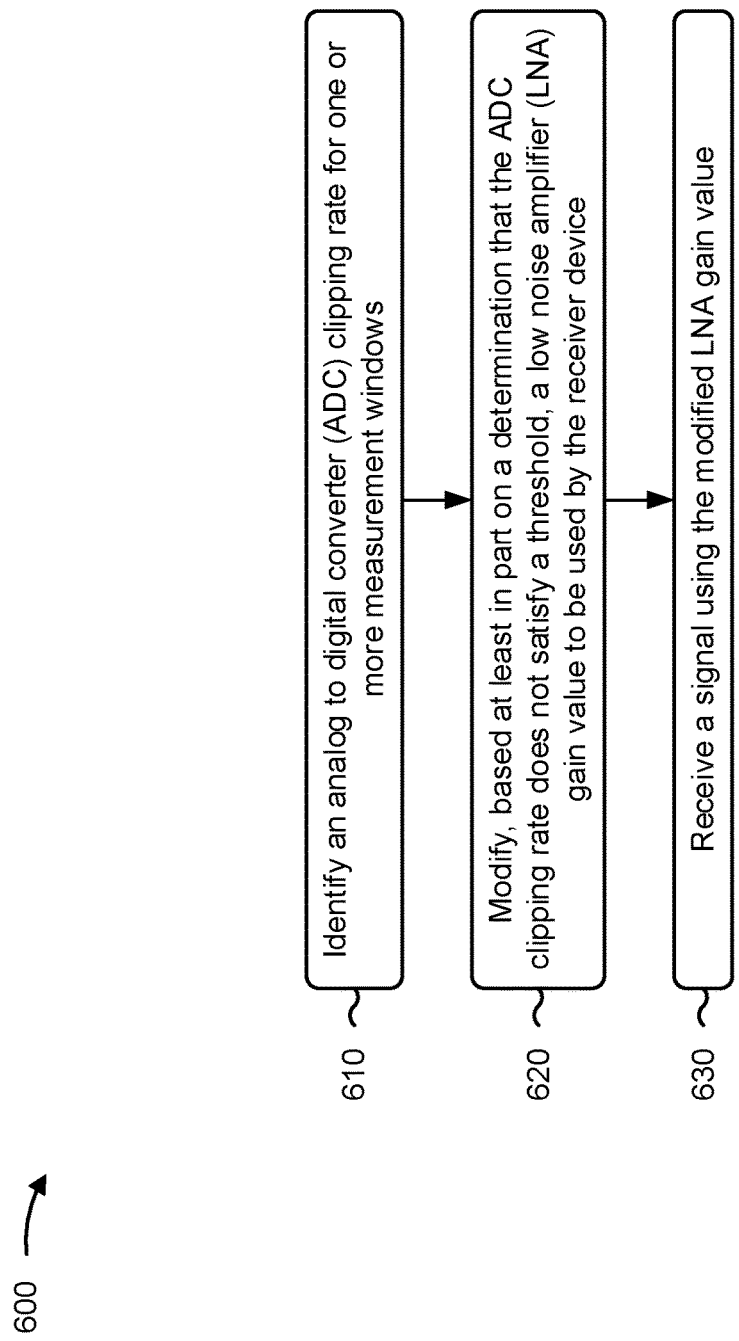
FIG. 6 is a diagram illustrating an example process associated with ADC clipping rate based LNA gain value modification, in accordance with various aspects of the present disclosure.

FIG. 6 is a diagram illustrating an example process 600 performed, for example, by a receiver device, in accordance with various aspects of the present disclosure. Example process 600 is an example where the receiver device (e.g., receiver device 505, a UE 120, a wireless node, or an IAB node) performs operations associated with techniques for ADC clipping rate based LNA gain value modification.

As shown in FIG. 6, in some aspects, process 600 may include identifying an ADC clipping rate for one or more measurement windows (block 610). For example, the receiver device (e.g., using identification component 708, depicted in FIG. 7) may identify an ADC clipping rate for one or more measurement windows, as described above. In some aspects, the operation of block 610 may be performed by the identification component 708.

As further shown in FIG. 6, in some aspects, process 600 may include modifying, based at least in part on a determination that the ADC clipping rate does not satisfy a threshold, an LNA gain value to be used by the receiver device (block 620). For example, the receiver device (e.g., using modification component 710, depicted in FIG. 7) may modify, based at least in part on a determination that the ADC clipping rate does not satisfy a threshold, an LNA gain value to be used by the receiver device, as described above. In some aspects, the operation of block 620 may be performed by the modification component 710.

As further shown in FIG. 6, in some aspects, process 600 may include receiving a signal using the modified LNA gain value (block 630). For example, the receiver device (e.g., using reception component 702, depicted in FIG. 7) may receive a signal using the modified LNA gain value, as described above. In some aspects, the operation of block 630 may be performed by the reception component 702.

Process 600 may include additional aspects, such as any single aspect or any combination of aspects described below and/or in connection with one or more other processes described elsewhere herein.

In a first aspect, identifying the ADC clipping rate for the one or more measurement windows comprises identifying, during each measurement window of the one or more measurement windows, an ADC clipping rate for each measurement window, and identifying the ADC clipping rate for the one or more measurement windows based at least in part on averaging the ADC clipping rate for each measurement window of the one or more measurement windows.

In a second aspect, alone or in combination with the first aspect, identifying, during each measurement window of the one or more measurement windows, the ADC clipping rate for each measurement window comprises measuring, during a measurement window of the one or more measurement windows, a plurality of ADC samples, determining a number of clipping occurrences associated with the plurality of ADC samples, and determining an ADC clipping rate for the measurement window based at least in part on the number of clipping occurrences and a number of the plurality of ADC samples.

In a third aspect, alone or in combination with second aspect, determining the number of clipping occurrences associated with the plurality of ADC samples comprises determining a number of occurrences in which a measurement of an ADC sample, of the plurality of ADC samples, is greater than or equal to a saturation threshold associated with the ADC of the receiver device.

In a fourth aspect, alone or in combination with one or more of the first through third aspects, receiving the signal using the modified LNA gain value comprises processing the signal using the modified LNA gain value, wherein processing the signal includes applying the modified LNA gain value to the signal, and performing an analog to digital conversion of the signal after the application of the modified LNA gain value to the signal.

In a fifth aspect, alone or in combination with one or more of the first through fourth aspects, modifying the LNA gain value comprises identifying a first LNA gain value that was used by the receiver device during the one or more measurement windows, and reducing the first LNA gain value to a second LNA gain value based at least in part on the determination that the ADC clipping rate does not satisfy the threshold.

In a sixth aspect, alone or in combination with the fifth aspect, the first LNA gain value is associated with a first LNA gain state and the second LNA gain value is associated with a second LNA gain state.

In a seventh aspect, alone or in combination with one or more of the first through sixth aspects, the threshold is based at least in part on a structure of the ADC of the receiver device.

In an eighth aspect, alone or in combination with one or more of the first through seventh aspects, process 600 includes storing, for the one or more measurement windows, one or more ADC clipping rates in a FIFO manner, wherein the FIFO manner includes storing a set number of ADC clipping rates.

In a ninth aspect, alone or in combination with the eighth aspect, identifying the ADC clipping rate for the one or more measurement windows comprises identifying the ADC clipping rate for the one or more measurement windows based at least in part on the one or more stored ADC clipping rates.

In a tenth aspect, alone or in combination with one or more of the first through ninth aspects, an in-band bandwidth of the ADC includes at least one intended signal and at least one unintended signal.

Although FIG. 6 shows example blocks of process 600, in some aspects, process 600 may include additional blocks, fewer blocks, different blocks, or differently arranged blocks than those depicted in FIG. 6. Additionally, or alternatively, two or more of the blocks of process 600 may be performed in parallel.

Figure 7:
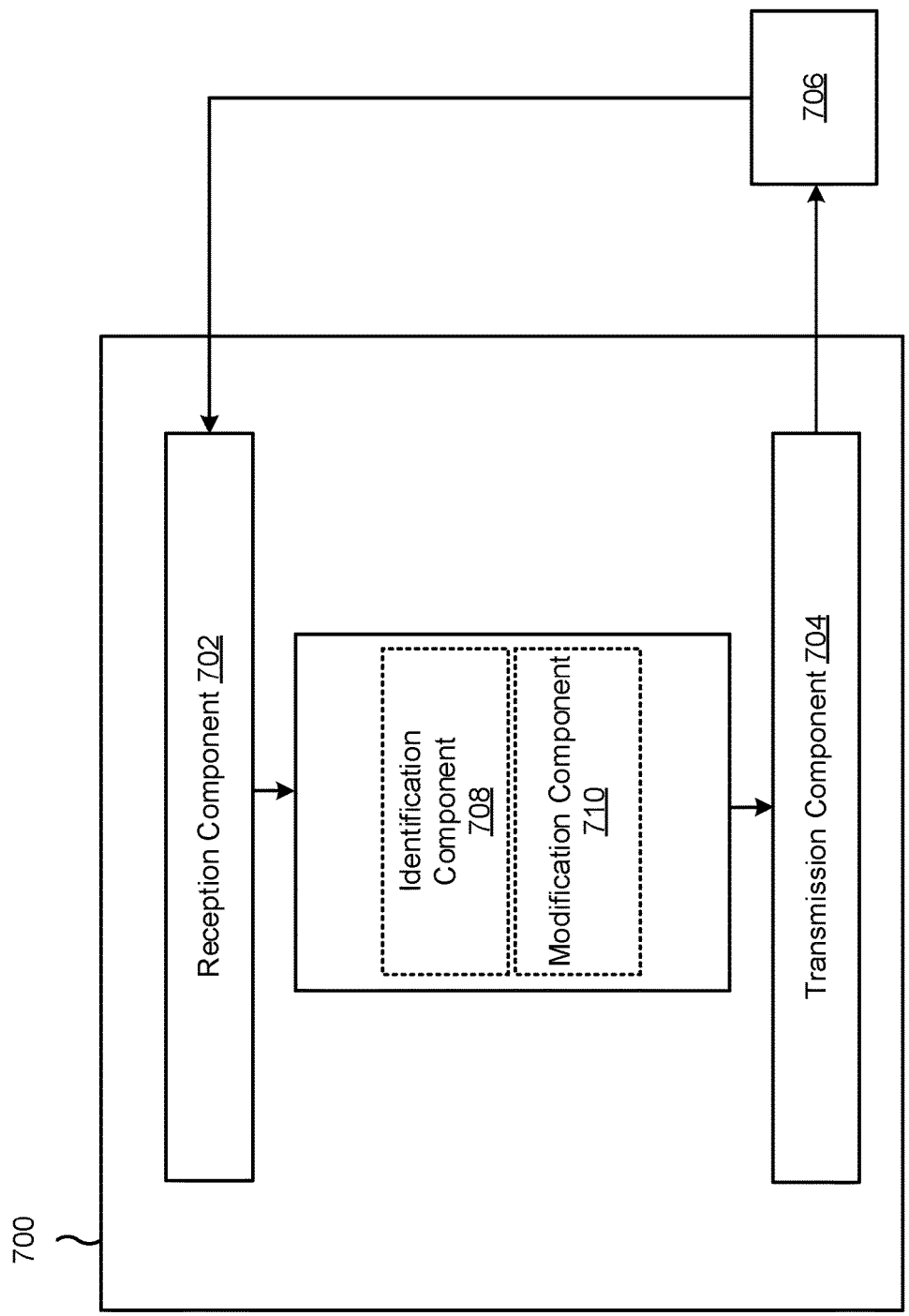
FIGS. 7 and 8 are block diagrams of example apparatuses for wireless communication, in accordance with various aspects of the present disclosure.

FIG. 7 is a block diagram of an example apparatus 700 for wireless communication. The apparatus 700 may be a receiver device, or a receiver device may include the apparatus 700. In some aspects, the apparatus 700 includes a reception component 702 and a transmission component 704, which may be in communication with one another (for example, via one or more buses and/or one or more other components). As shown, the apparatus 700 may communicate with another apparatus 706 (such as a UE, a base station, or another wireless communication device) using the reception component 702 and the transmission component 704. As further shown, the apparatus 700 may include one or more of an identification component 708, or a modification component 710, among other examples.

In some aspects, the apparatus 700 may be configured to perform one or more operations described herein in connection with FIG. 5. Additionally, or alternatively, the apparatus 700 may be configured to perform one or more processes described herein, such as process 600 of FIG. 6, or a combination thereof. In some aspects, the apparatus 700 and/or one or more components shown in FIG. 7 may include one or more components of the receiver device (or the UE 120) described above in connection with FIG. 2. Additionally, or alternatively, one or more components shown in FIG. 7 may be implemented within one or more components described above in connection with FIG. 2. Additionally, or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 702 may receive communications, such as reference signals, control information, data communications, or a combination thereof, from the apparatus 706. The reception component 702 may provide received communications to one or more other components of the apparatus 700. In some aspects, the reception component 702 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 706. In some aspects, the reception component 702 may include one or more antennas, a demodulator, a MIMO detector, a receive processor, a controller/processor, a memory, or a combination thereof, of the receiver device (or the UE 120) described above in connection with FIG. 2.

The transmission component 704 may transmit communications, such as reference signals, control information, data communications, or a combination thereof, to the apparatus 706. In some aspects, one or more other components of the apparatus 706 may generate communications and may provide the generated communications to the transmission component 704 for transmission to the apparatus 706. In some aspects, the transmission component 704 may perform signal processing on the generated communications (such as filtering, amplification, modulation, digital-to-analog conversion, multiplexing, interleaving, mapping, or encoding, among other examples), and may transmit the processed signals to the apparatus 706. In some aspects, the transmission component 704 may include one or more antennas, a modulator, a transmit MIMO processor, a transmit processor, a controller/processor, a memory, or a combination thereof, of the receiver device (or the UE 120) described above in connection with FIG. 2. In some aspects, the transmission component 704 may be co-located with the reception component 702 in a transceiver.

The identification component 708 may identify an ADC clipping rate for one or more measurement windows. The modification component 710 may modify, based at least in part on a determination that the ADC clipping rate does not satisfy a threshold, an LNA gain value to be used by the receiver device. The reception component 702 may receive a signal using the modified LNA gain value.

In some aspects, the identification component 708 may identify, during each measurement window of the one or more measurement windows, an ADC clipping rate for each measurement window. In some aspects, the identification component 708 may identify the ADC clipping rate for the one or more measurement windows based at least in part on averaging the ADC clipping rate for each measurement window of the one or more measurement windows.

In some aspects, the identification component 708 may measure, during a measurement window of the one or more measurement windows, a plurality of ADC samples. In some aspects, the identification component 708 may determine a number of clipping occurrences associated with the plurality of ADC samples. In some aspects, the identification component 708 may determine an ADC clipping rate for the measurement window based at least in part on the number of clipping occurrences and a number of the plurality of ADC samples.

In some aspects, the identification component 708 may determine a number of occurrences in which a measurement of an ADC sample, of the plurality of ADC samples, is greater than or equal to a saturation threshold associated with the ADC of the receiver device.

In some aspects, the reception component 702 may process the signal using the modified LNA gain value. In some aspects, the reception component 702 may apply the modified LNA gain value to the signal. In some aspects, the reception component 702 may perform an analog to digital conversion of the signal after the application of the modified LNA gain value to the signal.

In some aspects, the modification component 710 may identify a first LNA gain value that was used by the receiver device during the one or more measurement windows. In some aspects, the modification component 710 may reduce the first LNA gain value to a second LNA gain value based at least in part on the determination that the ADC clipping rate does not satisfy the threshold.

In some aspects, the identification component 708 may store, for the one or more measurement windows, one or more ADC clipping rates in a FIFO manner, where the FIFO manner includes storing a set number of ADC clipping rates. In some aspects, the identification component 708 may identify the ADC clipping rate for the one or more measurement windows based at least in part on the one or more stored ADC clipping rates.

The number and arrangement of components shown in FIG. 7 are provided as an example. In practice, there may be additional components, fewer components, different components, or differently arranged components than those shown in FIG. 7. Furthermore, two or more components shown in FIG. 7 may be implemented within a single component, or a single component shown in FIG. 7 may be implemented as multiple, distributed components. Additionally, or alternatively, a set of (one or more) components shown in FIG. 7 may perform one or more functions described as being performed by another set of components shown in FIG. 7.

Figure 8:
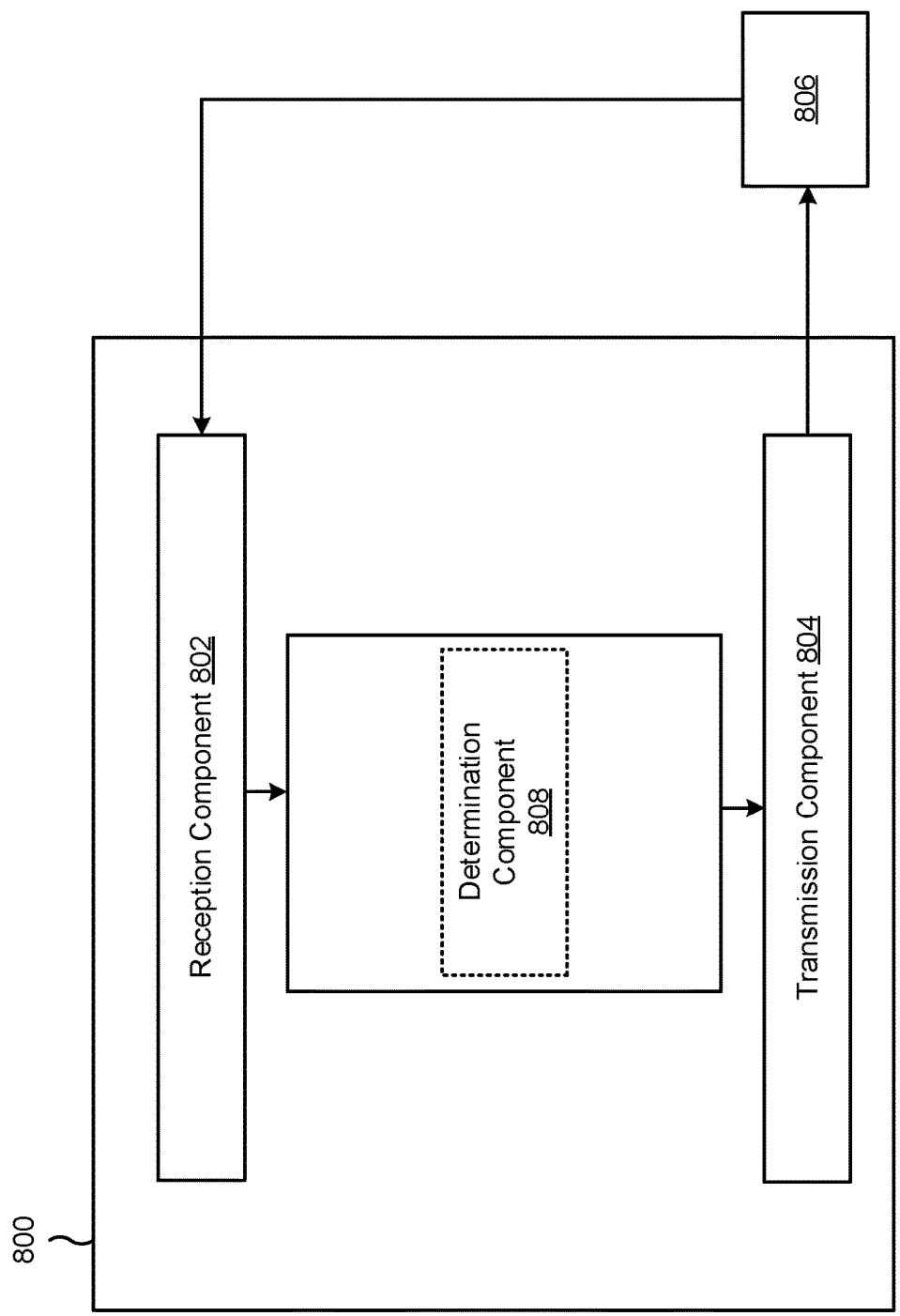

FIG. 8 is a block diagram of an example apparatus 800 for wireless communication. The apparatus 800 may be a base station, or a base station may include the apparatus 800. In some aspects, the apparatus 800 includes a reception component 802 and a transmission component 804, which may be in communication with one another (for example, via one or more buses and/or one or more other components). As shown, the apparatus 800 may communicate with another apparatus 806 (such as a UE, a base station, or another wireless communication device) using the reception component 802 and the transmission component 804. As further shown, the apparatus 800 may include a determination component 808, among other examples.

In some aspects, the apparatus 800 may be configured to perform one or more operations described herein in connection with FIG. 5. Additionally, or alternatively, the apparatus 800 may be configured to perform one or more processes described herein or a combination thereof. In some aspects, the apparatus 800 and/or one or more components shown in FIG. 8 may include one or more components of the base station described above in connection with FIG. 2. Additionally, or alternatively, one or more components shown in FIG. 8 may be implemented within one or more components described above in connection with FIG. 2. Additionally, or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 802 may receive communications, such as reference signals, control information, data communications, or a combination thereof, from the apparatus 806. The reception component 802 may provide received communications to one or more other components of the apparatus 800. In some aspects, the reception component 802 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 806. In some aspects, the reception component 802 may include one or more antennas, a demodulator, a MIMO detector, a receive processor, a controller/processor, a memory, or a combination thereof, of the base station described above in connection with FIG. 2.

The transmission component 804 may transmit communications, such as reference signals, control information, data communications, or a combination thereof, to the apparatus 806. In some aspects, one or more other components of the apparatus 806 may generate communications and may provide the generated communications to the transmission component 804 for transmission to the apparatus 806. In some aspects, the transmission component 804 may perform signal processing on the generated communications (such as filtering, amplification, modulation, digital-to-analog conversion, multiplexing, interleaving, mapping, or encoding, among other examples), and may transmit the processed signals to the apparatus 806. In some aspects, the transmission component 804 may include one or more antennas, a modulator, a transmit MIMO processor, a transmit processor, a controller/processor, a memory, or a combination thereof, of the base station described above in connection with FIG. 2. In some aspects, the transmission component 804 may be co-located with the reception component 802 in a transceiver.

The transmission component 804 may transmit one or more or more signals to a receiver device. The determination component 808 may determine and/or identify one or more actions associated with communicating with the receiver device.

The number and arrangement of components shown in FIG. 8 are provided as an example. In practice, there may be additional components, fewer components, different components, or differently arranged components than those shown in FIG. 8. Furthermore, two or more components shown in FIG. 8 may be implemented within a single component, or a single component shown in FIG. 8 may be implemented as multiple, distributed components. Additionally, or alternatively, a set of (one or more) components shown in FIG. 8 may perform one or more functions described as being performed by another set of components shown in FIG. 8.

The following provides an overview of aspects of the present disclosure:

Aspect 1: A method of wireless communication performed by a receiver device, comprising: identifying an analog to digital converter (ADC) clipping rate for one or more measurement windows; modifying, based at least in part on a determination that the ADC clipping rate does not satisfy a threshold, a low noise amplifier (LNA) gain value to be used by the receiver device; and receiving a signal using the modified LNA gain value.

Aspect 2: The method of aspect 1, wherein the identification of the ADC clipping rate for the one or more measurement windows comprises: identifying, during each measurement window of the one or more measurement windows, an ADC clipping rate for each measurement window; and identifying the ADC clipping rate for the one or more measurement windows based at least in part on averaging the ADC clipping rate for each measurement window of the one or more measurement windows.

Aspect 3: The method of aspect 2, wherein the identification, during each measurement window of the one or more measurement windows, of the ADC clipping rate for each measurement window comprises: measuring, during a measurement window of the one or more measurement windows, a plurality of ADC samples; determining a number of clipping occurrences associated with the plurality of ADC samples; and determining an ADC clipping rate for the measurement window based at least in part on the number of clipping occurrences and a number of the plurality of ADC samples.

Aspect 4: The method of aspect 3, wherein the determination of the number of clipping occurrences associated with the plurality of ADC samples comprises: determining a number of occurrences in which a measurement of an ADC sample, of the plurality of ADC samples, is greater than or equal to a saturation threshold associated with the ADC of the receiver device.

Aspect 5: The method of any of aspects 1-4, wherein the reception of the signal using the modified LNA gain value comprises: processing the signal using the modified LNA gain value, wherein processing the signal includes: applying the modified LNA gain value to the signal; and performing an analog to digital conversion of the signal after the application of the modified LNA gain value to the signal.

Aspect 6: The method of any of aspects 1-5, wherein the modification of the LNA gain value comprises: identifying a first LNA gain value that was used by the receiver device during the one or more measurement windows; and reducing the first LNA gain value to a second LNA gain value based at least in part on the determination that the ADC clipping rate does not satisfy the threshold.

Aspect 7: The method of aspect 6, wherein the first LNA gain value is associated with a first LNA gain state and the second LNA gain value is associated with a second LNA gain state.

Aspect 8: The method of any of aspects 1-7, wherein the threshold is based at least in part on a structure of the ADC of the receiver device.

Aspect 9: The method of any of aspects 1-8, further comprising: storing, for the one or more measurement windows, one or more ADC clipping rates in a first-in-first-out (FIFO) manner, wherein the FIFO manner includes storing a set number of ADC clipping rates.

Aspect 10: The method of aspect 9, wherein the identification of the ADC clipping rate for the one or more measurement windows comprises: identifying the ADC clipping rate for the one or more measurement windows based at least in part on the one or more stored ADC clipping rates.

Aspect 11: The method of any of aspects 1-10, wherein an in-band bandwidth of the ADC includes at least one intended signal and at least one unintended signal.

Aspect 12: An apparatus for wireless communication at a device, comprising a processor; memory coupled with the processor; and instructions stored in the memory and executable by the processor to cause the apparatus to perform the method of one or more aspects of aspects 1-11.

Aspect 13: A device for wireless communication, comprising a memory and one or more processors coupled to the memory, the memory and the one or more processors configured to perform the method of one or more aspects of aspects 1-11.

Aspect 14: An apparatus for wireless communication, comprising at least one means for performing the method of one or more aspects of aspects 1-11.

Aspect 15: A non-transitory computer-readable medium storing code for wireless communication, the code comprising instructions executable by a processor to perform the method of one or more aspects of aspects 1-11.

Aspect 16: A non-transitory computer-readable medium storing a set of instructions for wireless communication, the set of instructions comprising one or more instructions that, when executed by one or more processors of a device, cause the device to perform the method of one or more aspects of aspects 1-11.

The foregoing disclosure provides illustration and description, but is not intended to be exhaustive or to limit the aspects to the precise forms disclosed. Modifications and variations may be made in light of the above disclosure or may be acquired from practice of the aspects.

As used herein, the term "component" is intended to be broadly construed as hardware, firmware, and/or a combination of hardware and software. As used herein, a processor is implemented in hardware, firmware, and/or a combination of hardware and software. It will be apparent that systems and/or methods described herein may be implemented in different forms of hardware, firmware, and/or a combination of hardware and software. The actual specialized control hardware or software code used to implement these systems and/or methods is not limiting of the aspects. Thus, the operation and behavior of the systems and/or methods were described herein without reference to specific software code—it being understood that software and hardware can be designed to implement the systems and/or methods based, at least in part, on the description herein.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various aspects. In fact, many of these features may be combined in ways not specifically recited in the claims and/or disclosed in the specification. Although each dependent claim listed below may directly depend on only one claim, the disclosure of various aspects includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the terms "set" and "group" are intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A method of wireless communication performed by a receiver device, comprising:
   identifying, during each measurement window of one or more measurement windows, an analog to digital converter (ADC) clipping rate for each measurement window of the one or more measurement windows;
   identifying an average ADC clipping rate for the one or more measurement windows based at least in part on averaging the ADC clipping rate for each measurement window of the one or more measurement windows;
   modifying, based at least in part on a determination that the average ADC clipping rate does not satisfy a threshold, a low noise amplifier (LNA) gain value to be used by the receiver device; and
   receiving a signal using the modified LNA gain value.

2. The method of claim 1, wherein identifying the ADC clipping rate for each measurement window of the one or more measurement windows comprises:
   measuring, during a measurement window of the one or more measurement windows, a plurality of ADC samples;
   determining a number of clipping occurrences associated with the plurality of ADC samples; and
   determining an ADC clipping rate for the measurement window based at least in part on the number of clipping occurrences and a number of the plurality of ADC samples.

3. The method of claim 2, wherein determining the number of clipping occurrences associated with the plurality of ADC samples comprises:
   determining a number of occurrences in which a measurement of an ADC sample, of the plurality of ADC samples, is greater than or equal to a saturation threshold associated with an ADC of the receiver device.

4. The method of claim 1, wherein receiving the signal using the modified LNA gain value comprises:
   processing the signal using the modified LNA gain value, wherein processing the signal includes:
      applying the modified LNA gain value to the signal; and
      performing an analog to digital conversion of the signal after applying the modified LNA gain value to the signal.

5. The method of claim 1, wherein modifying the LNA gain value comprises:
   identifying a first LNA gain value that was used by the receiver device during the one or more measurement windows; and
   reducing the first LNA gain value to a second LNA gain value based at least in part on the determination that the average ADC clipping rate does not satisfy the threshold.

6. The method of claim 5, wherein the first LNA gain value is associated with a first LNA gain state and the second LNA gain value is associated with a second LNA gain state.

7. The method of claim 1, wherein the threshold is based at least in part on a structure of an ADC of the receiver device.

8. The method of claim 1, further comprising:
   storing, for the one or more measurement windows, one or more ADC clipping rates in a first-in-first-out (FIFO) manner, wherein the FIFO manner includes storing a set number of ADC clipping rates.

9. The method of claim 8, wherein identifying the average ADC clipping rate comprises:
   identifying the average ADC clipping rate based at least in part on the one or more stored ADC clipping rates.

10. The method of claim 1, wherein an in-band bandwidth of an ADC includes at least one intended signal and at least one unintended signal.

11. A receiver device for wireless communication, comprising:
    a memory; and
    one or more processors coupled to the memory, the one or more processors configured to:
       identify, during each measurement window of one or more measurement windows, an analog to digital converter (ADC) clipping rate for each measurement window of the one or more measurement windows;
       identify an average ADC clipping rate for the one or more measurement windows based at least in part on averaging the ADC clipping rate for each measurement window of the one or more measurement windows;
       modify, based at least in part on a determination that the average ADC clipping rate does not satisfy a threshold, a low noise amplifier (LNA) gain value to be used by the receiver device; and
       receive a signal using the modified LNA gain value.

12. The receiver device of claim 11, wherein the one or more processors, when identifying the ADC clipping rate for each measurement window of the one or more measurement windows, are configured to:
    measure, during a measurement window of the one or more measurement windows, a plurality of ADC samples;
    determine a number of clipping occurrences associated with the plurality of ADC samples; and
    determine an ADC clipping rate for the measurement window based at least in part on the number of clipping occurrences and a number of the plurality of ADC samples.

13. The receiver device of claim 12, wherein the one or more processors, when determining the number of clipping occurrences associated with the plurality of ADC samples, are configured to:
    determine a number of occurrences in which a measurement of an ADC sample, of the plurality of ADC samples, is greater than or equal to a saturation threshold associated with an ADC of the receiver device.

14. The receiver device of claim 11, wherein the one or more processors, when receiving the signal using the modified LNA gain value, are configured to:
    process the signal using the modified LNA gain value, wherein the one or more processors, when processing the signal, are configured to:
apply the modified LNA gain value to the signal; and
perform an analog to digital conversion of the signal after applying the modified LNA gain value to the signal.

15. The receiver device of claim 11, wherein the one or more processors, when modifying the LNA gain value, are configured to:
identify a first LNA gain value that was used by the receiver device during the one or more measurement windows; and
reduce the first LNA gain value to a second LNA gain value based at least in part on the determination that the average ADC clipping rate does not satisfy the threshold.

16. The receiver device of claim 15, wherein the first LNA gain value is associated with a first LNA gain state and the second LNA gain value is associated with a second LNA gain state.

17. The receiver device of claim 11, wherein the one or more processors are further configured to:
store, for the one or more measurement windows, one or more ADC clipping rates in a first-in-first-out (FIFO) manner, wherein the FIFO manner includes storing a set number of ADC clipping rates.

18. The receiver device of claim 17, wherein the one or more processors, when identifying the average ADC clipping rate, are configured to:
identify the average ADC clipping rate based at least in part on the one or more stored ADC clipping rates.

19. A non-transitory computer-readable medium storing a set of instructions for wireless communication, the set of instructions comprising:
one or more instructions that, when executed by one or more processors of a receiver device, cause the receiver device to:
identify, during each measurement window of one or more measurement windows, an analog to digital converter (ADC) clipping rate for each measurement window of the one or more measurement windows;
identify an average ADC clipping rate for the one or more measurement windows based at least in part on averaging the ADC clipping rate for each measurement window of the one or more measurement windows;
modify, based at least in part on a determination that the average ADC clipping rate does not satisfy a threshold, a low noise amplifier (LNA) gain value to be used by the receiver device; and
receive a signal using the modified LNA gain value.

20. The receiver device of claim 11, wherein the threshold is based at least in part on a structure of an ADC of the receiver device.

21. The receiver device of claim 11, wherein an in-band bandwidth of an ADC includes at least one intended signal and at least one unintended signal.

22. The non-transitory computer-readable medium of claim 19, wherein the one or more instructions, that cause the receiver device to identify the ADC clipping rate for each measurement window of the one or more measurement windows, cause the receiver device to:
measure, during a measurement window of the one or more measurement windows, a plurality of ADC samples;
determine a number of clipping occurrences associated with the plurality of ADC samples; and
determine an ADC clipping rate for the measurement window based at least in part on the number of clipping occurrences and a number of the plurality of ADC samples.

23. The non-transitory computer-readable medium of claim 19, wherein the one or more instructions, that cause the receiver device to modify the LNA gain value, cause the receiver device to:
identify a first LNA gain value that was used by the receiver device during the one or more measurement windows; and
reduce the first LNA gain value to a second LNA gain value based at least in part on the determination that the average ADC clipping rate does not satisfy the threshold.

24. The non-transitory computer-readable medium of claim 19, wherein the one or more instructions further cause the receiver device to:
store, for the one or more measurement windows, one or more ADC clipping rates in a first-in-first-out (FIFO) manner, wherein the FIFO manner includes storing a set number of ADC clipping rates.

25. An apparatus for wireless communication, comprising:
means for identifying, during each measurement window of one or more measurement windows, an analog to digital converter (ADC) clipping rate for each measurement window of the one or more measurement windows;
means for identifying an average ADC clipping rate for the one or more measurement windows based at least in part on averaging the ADC clipping rate for each measurement window of the one or more measurement windows;
means for modifying, based at least in part on a determination that the average ADC clipping rate does not satisfy a threshold, a low noise amplifier (LNA) gain value to be used by the apparatus; and
means for receiving a signal using the modified LNA gain value.

26. The apparatus of claim 25, wherein the means for identifying the ADC clipping rate for each measurement window of the one or more measurement windows comprises:
means for measuring, during a measurement window of the one or more measurement windows, a plurality of ADC samples;
means for determining a number of clipping occurrences associated with the plurality of ADC samples; and
means for determining an ADC clipping rate for the measurement window based at least in part on the number of clipping occurrences and a number of the plurality of ADC samples.

27. The apparatus of claim 25, wherein the means for modifying the LNA gain value comprises:
means for identifying a first LNA gain value that was used by the apparatus during the one or more measurement windows; and
means for reducing the first LNA gain value to a second LNA gain value based at least in part on the determination that the average ADC clipping rate does not satisfy the threshold.

28. The apparatus of claim 25, further comprising:
means for storing, for the one or more measurement windows, one or more ADC clipping rates in a first-in-first-out (FIFO) manner, wherein the FIFO manner includes storing a set number of ADC clipping rates.

29. The non-transitory computer-readable medium of claim 22, wherein the one or more instructions, that cause the receiver device to determine the number of clipping occurrences associated with the plurality of ADC samples, cause the receiver device to:
- determine a number of occurrences in which a measurement of an ADC sample, of the plurality of ADC samples, is greater than or equal to a saturation threshold associated with an ADC of the receiver device.

30. The non-transitory computer-readable medium of claim 19, wherein the one or more instructions, that cause the receiver device to receive the signal using the modified LNA gain value, cause the receiver device to:
- process the signal using the modified LNA gain value, wherein the one or more instructions, that cause the receiver device to process the signal, cause the receiver device to:
  - apply the modified LNA gain value to the signal; and
  - perform an analog to digital conversion of the signal after applying the modified LNA gain value to the signal.

\* \* \* \* \*